United States Patent
Murakami et al.

(10) Patent No.: US 6,652,969 B1
(45) Date of Patent: Nov. 25, 2003

(54) CARBON FILM METHOD FOR FORMATION THEREOF AND ARTICLE COVERED WITH CARBON FILM AND METHOD FOR PREPARATION THEREOF

(75) Inventors: Yasuo Murakami, Kyoto (JP); Takahiro Nakahigashi, Kyoto (JP); Jo Takeuchi, Kyoto (JP)

(73) Assignee: Nissin Electric Co., LTD, Kyoto (JP)

( * ) Notice: Subject to any disclaimer, the term of this patent is extended or adjusted under 35 U.S.C. 154(b) by 0 days.

(21) Appl. No.: 09/744,985
(22) PCT Filed: Jun. 14, 2000
(86) PCT No.: PCT/JP00/03886
§ 371 (c)(1),
(2), (4) Date: Apr. 11, 2001
(87) PCT Pub. No.: WO00/79020
PCT Pub. Date: Dec. 28, 2000

(30) Foreign Application Priority Data

Jun. 18, 1999 (JP) .............................. 11-172130

(51) Int. Cl.[7] ............... B32B 9/00; C23C 16/26; C10B 31/02
(52) U.S. Cl. ............... 428/408; 427/249.1; 427/249.7; 427/577; 428/446; 428/698; 428/704
(58) Field of Search .................. 427/255, 249.1, 427/577, 249.7; 428/408, 698, 704, 446

(56) References Cited

U.S. PATENT DOCUMENTS

| | | | |
|---|---|---|---|
| 4,869,923 A | | 9/1989 | Yamazaki |
| 5,122,249 A | * | 6/1992 | Niemann et al. |
| 5,198,285 A | | 3/1993 | Arai et al. |
| 5,462,784 A | * | 10/1995 | Grill et al. |
| 5,616,374 A | | 4/1997 | Sho |
| 5,750,210 A | * | 5/1998 | Schmidt et al. |
| 5,771,873 A | * | 6/1998 | Potter et al. |
| 5,900,290 A | * | 5/1999 | Yang et al. |
| 5,942,328 A | * | 8/1999 | Grill et al. |
| 6,071,797 A | | 6/2000 | Endo et al. |

FOREIGN PATENT DOCUMENTS

| | | |
|---|---|---|
| EP | 0284190 A2 | 9/1988 |
| EP | 0435312 A1 | 7/1991 |
| EP | 0668372 A1 | 8/1995 |
| EP | 0768388 A2 | 4/1997 |
| EP | 0 821 077 * | 1/1998 |
| JP | 59030709 A | 2/1984 |
| JP | 61174376 A | 8/1986 |
| JP | 62180072 A | 8/1987 |
| JP | 63210010 A | 8/1988 |

(List continued on next page.)

OTHER PUBLICATIONS

Fracassi et al PECVD of SOxNyCzHw Thin Films from Hexamethyldisilazane Containing Feed. Investigation on Chemucal Characteristics and Aging Behavior' Plasmas & Polymers, vol. 2, No. 1, 1997.*

*Primary Examiner*—Archene Turner
(74) *Attorney, Agent, or Firm*—Arent Fox Kintner Plotkin & Kahn PLLC

(57) ABSTRACT

A carbon film containing fluorine and hydrogen, wherein a spectrum determined by FT-IR (Fourier Transform Infrared) spectrum analysis exhibits such a relationship that a ratio (IR.C—F)/(IR.C—H) between a peak area (IR.C—F) in a range from 1000 $cm^{-1-1300cm^{-1}}$ resulting from C—F bonds and a peak area (IR.C—H) in a range from 2800 $cm^{-1}$ to 3100 $cm^{-1}$ resulting from C—H bonds is larger than 0, and a spectrum determined by XPS (X-ray photoelectron spectrum analysis) exhibits such a relationship that a ratio ($F_{1S}/C_{1S}$) between a peak intensity resulting from $F_{1S}$ and a peak intensity resulting from $C_{1S}$ is larger than 0 and smaller than 3. A carbon film containing hydrogen and nitrogen. A carbon film containing at least one of metal, metal compound, silicon and silicon compound.

24 Claims, 12 Drawing Sheets

FOREIGN PATENT DOCUMENTS

| | | |
|---|---|---|
| JP | 03240957 A | 10/1991 |
| JP | 05339731 A | 12/1993 |
| JP | 06101047 A | 4/1994 |
| JP | 07054150 A | 2/1995 |
| JP | 7-309697 | 11/1995 |
| JP | 09111455 A | 4/1997 |
| JP | 09176858 A | 7/1997 |
| JP | 11092934 A | 4/1999 |
| JP | 11106920 A | 4/1999 |
| JP | 11130590 A | 5/1999 |
| JP | 11158631 A | 6/1999 |
| JP | 2000-96233 | 4/2000 |
| KR | 97-21367 | 5/1997 |

* cited by examiner

CARBON FILM METHOD FOR FORMATION THEREOF AND ARTICLE COVERED WITH CARBON FILM AND METHOD FOR PREPARATION THEREOF

TECHNICAL FIELD

The present invention relates to a carbon film, and particularly relates to a carbon film containing, in addition to carbon, fluorine and hydrogen, a carbon film containing, in addition to carbon, hydrogen and nitrogen, a carbon film containing, in addition to carbon, hydrogen and at least one of metal, metal compound, silicon and silicon compound as well as a method of forming the same, an object coated with a carbon film, and a method of manufacturing the same.

BACKGROUND ART

Lubricants such as oil and wax have been conventionally applied to surfaces of objects, which are in slide contact with each other, such as various kinds of machine parts and members, which are in slide contact with each other, for ensuring good sliding property, suppressing wearing of the objects themselves and other purposes. However, such lubricants are soon consumed so that it is difficult to keep it. In some cases, flowable lubricant such as oil cannot be used even if lubricity is required.

In these days, therefore, such manners have been proposed that a material such as fluoride such as polytetrafluorethylene or the like, which has high lubricity and can stably keep the lubricity for a long term, as compared with conventional lubricating oil and others, is applied in advance to the object surface to form a non-flowable lubricating coating film, and that a sheet or film made of lubricating fluoride is attached to the object surface, e.g., by adhesion. These manners have been widely available.

A carbon film has been known as a material, which provide a necessary hardness to the object surface while providing certain lubricity. The carbon films have been utilized as coating films of machine parts for the purpose of applying a resistance against wear.

Among carbon films, a DLC film (Diamond-Like Carbon film) is superior in wear resistance, electrical insulation, water repellency and others, is optically transparent, has such a feature that a thickness thereof can be adjusted to provide good adhesion without impairing flexibility of a carbon-film-coated base member itself if the base member is flexible, and can be easily formed at a relatively low temperature by employing a plasma CVD method or the like. Owing to these advantages, it is used as a coating film for various kinds of objects.

However, the lubricating fluoride such as polytetrafluorethylene does not have a sufficiently high hardness. Accordingly, the foregoing coating film, sheet film or the like, which can be more stable for a long term than lubricating oil or the like, is liable to be worn, or is liable to break and drop from the main body of the object due to its softness.

Some objects have surfaces formed of elastic materials, depending on their use. However, the foregoing coating film, sheet, film or the like, which are formed on such elastically deformable portions, are liable to be peeled off due to elastic deformation of the objects.

Pieces of the lubricating material, which dropped from the object, may cause unexpected situations such as an operation failure of a machine, for example, when they bite the sliding surfaces.

The foregoing carbon film is superior to the lubricating fluoride in wear resistance, adhesion to the object and others, but is sometimes required to have improved sliding property (lubricity) with respect to another object.

The carbon film is sometimes required to have further improved hardness for further improving the effect of improving the surface quality of the carbon-film-coated base member when the carbon-film-coated base member have a large resistance against deformation so that the carbon film is not required to follow the deformation of the base member to a large extent, it is not necessary to give consideration to such following property.

An object of the invention is to provide a carbon film, which has a larger hardness and a better wear resistance than lubricating fluoride in the prior art, and has a better adhesion to an object than the lubricating fluoride, as well as a method of forming the same.

Another object of the invention is to provide a carbon film, which has a larger hardness and a better wear resistance than lubricating fluoride in the prior art, has a better lubricity than a conventional carbon film, and has a better adhesion to an object than the lubricating fluoride, as well as a method of forming the same.

Still another object of the invention is to provide a carbon-film-coated object, which is coated with a carbon film having a larger hardness and a better wear resistance than lubricating fluoride in the prior art, and having a better adhesion to the object than the lubricating fluoride, and thereby has a good durability, as well as a method of forming the same.

Yet another object of the invention is to provide a carbon-film-coated object, which is coated with a carbon film having a larger hardness and a better wear resistance than lubricating fluoride in the prior art, having a better lubricity than a conventional carbon film and having a better adhesion to the object than the lubricating fluoride, and thereby has a good durability, as well as a method of forming the same.

DISCLOSURE OF THE INVENTION

The invention provides a carbon film and a carbon-film-coated object as well as a carbon film forming method and a method of manufacturing a carbon-film-coated object, which are described below.

[1] Carbon Film (1) A carbon film containing fluorine and hydrogen, wherein a spectrum determined by FT-IR (Fourier Transform Infrared) spectrum analysis exhibits such a relationship that a ratio (IR.C—F)/(IR.C—H) between a peak area (IR.C—F) in a range from 1000 $cm^{-1}$–1300 $cm^{-1}$ resulting from C—F bonds and a peak area (IR.C—H) in a range from 2800 $cm^{-1}$ to 3100 $cm^{-1}$ resulting from C—H bonds is larger than 0, and a spectrum determined by XPS (X-ray photoelectron spectrum analysis) exhibits such a relationship that a ratio ($F_{1S}/C_{1S}$) between a peak intensity resulting from $F_{1S}$ and a peak intensity resulting from $C_{1S}$ is larger than 0 and smaller than 3.

(2) A carbon film containing hydrogen and nitrogen.

(3) A carbon film containing hydrogen and at least one of metal, metal compound, silicon and silicon compound.

[2] Carbon-Film-Coated Object (1) A carbon-film-coated object coated with the carbon film described in the foregoing item (1) in [1].

(2) A carbon-film-coated object coated with the carbon film described in the foregoing item (2) in [1].

(3) A carbon-film-coated object coated with the carbon film described in the foregoing item (3) in [1].

[3] Carbon Film Forming Method (1) A method of forming a carbon film containing fluorine and hydrogen, in which a carbon film formation base member is located in a deposition chamber, a gas containing a hydrocarbon compound gas and a carbon fluoride compound gas is supplied as a deposition material gas into the deposition chamber, a predetermined pressure is kept in the deposition chamber, plasma is formed from the gas by application of an electric power, the carbon film containing fluorine and hydrogen is formed on the base member from the plasma, and a mixing ratio between the hydrocarbon compound gas and the carbon fluoride compound gas in the supply of the gases is adjusted to form the carbon film providing a spectrum, determined by FT-IR (Fourier Transform Infrared) spectrum analysis, exhibiting such a relationship that a ratio (IR.C—F)/(IR.C—H) between a peak area (IR.C—F) in a range from 1000 $cm^{-1}$–1300 $cm^{-1}$ resulting from C—F bonds and a peak area (IR.C—H) in a range from 2800 $cm^{-1}$ to 3100 $cm^{-1}$ resulting from C—H bonds is larger than 0, and a spectrum, determined by XPS (X-ray photoelectron spectrum analysis), exhibiting such a relationship that a ratio ($F_{1S}/C_{1S}$) between a peak intensity resulting from $F_{1S}$ and a peak intensity resulting from $C_{1S}$ is larger than 0 and smaller than 3.

(2) A method of forming a carbon film containing hydrogen and nitrogen, in which a carbon film formation base member is located in a deposition chamber, a gas containing a hydrocarbon compound gas and a carbon fluoride compound gas is supplied as a deposition material gas into the deposition chamber, a predetermined pressure is kept in the deposition chamber, plasma is formed from the gas by application of an electric power, and the carbon film containing hydrogen and nitrogen is formed on the base member from the plasma.

(3) A method of forming a carbon film containing hydrogen and at least one of metal, metal compound, silicon and silicon compound, in which a carbon film formation base member is located in a deposition chamber, a gas containing a hydrocarbon compound gas and a gas forming at least one of metal, metal compound, silicon and silicon compound is supplied as a deposition material gas into the deposition chamber, a predetermined pressure is kept in the deposition chamber, plasma is formed from the gas by application of an electric power, and the carbon film containing hydrogen and at least one of metal, metal compound, silicon and silicon compound is formed on the base member from the plasma.

(4) A method of forming a carbon film containing hydrogen and at least one of metal, metal compound, silicon and silicon compound, in which a deposition chamber formed of a plasma producing chamber and a plasma processing chamber connected thereto is employed, a carbon film formation base member is located in the plasma processing chamber, a sputter target formed of at least one of metal, metal compound, silicon and silicon compound is located in the plasma producing chamber, a hydrocarbon compound gas is supplied into the plasma processing chamber, and a sputtering gas is supplied into the plasma producing chamber; and (a) plasma is formed from the gas supplied into the plasma producing chamber by application of an electric power, the plasma as well as sputter particles generated by sputtering effected on the sputter target in the plasma are supplied into the plasma processing chamber to decompose (form plasma from) the hydrocarbon compound gas supplied into the plasma processing chamber, and the carbon film containing hydrogen and at least one of metal, metal compound, silicon and silicon compound is formed on the base member, or (b) plasma is formed from the gas supplied into the plasma producing chamber by application of an electric power, sputter particles generated by sputtering effected on the sputter target in the plasma are supplied into the plasma processing chamber, plasma is also formed from the hydrocarbon compound gas supplied into the plasma processing chamber by application of an electric power, and the carbon film containing hydrogen and at least one of metal, metal compound, silicon and silicon compound is formed on the base member.

[4] Method of Manufacturing Carbon-Film-Coated Object (1) A carbon-film-coated object manufacturing method of manufacturing an object coated with a carbon film, in which a predetermined object is employed as the carbon film formation base member in the carbon film forming method described in the above item (1) in [3].

(2) A carbon-film-coated object manufacturing method of manufacturing an object coated with a carbon film, in which a predetermined object is employed as the carbon film formation base member in the carbon film forming method described in the above item (2) in [3].

(3) A carbon-film-coated object manufacturing method of manufacturing an object coated with a carbon film, in which a predetermined object is employed as the carbon film formation base member in the carbon film forming method described in the above item (3) in [3].

(4) A carbon-film-coated object manufacturing method of manufacturing an object coated with a carbon film, in which a predetermined object is employed as the carbon film formation base member in the carbon film forming method described in the above item (4) in [3].

PREFERRED EMBODIMENTS FOR IMPLEMENTING THE INVENTION

Figure 1:
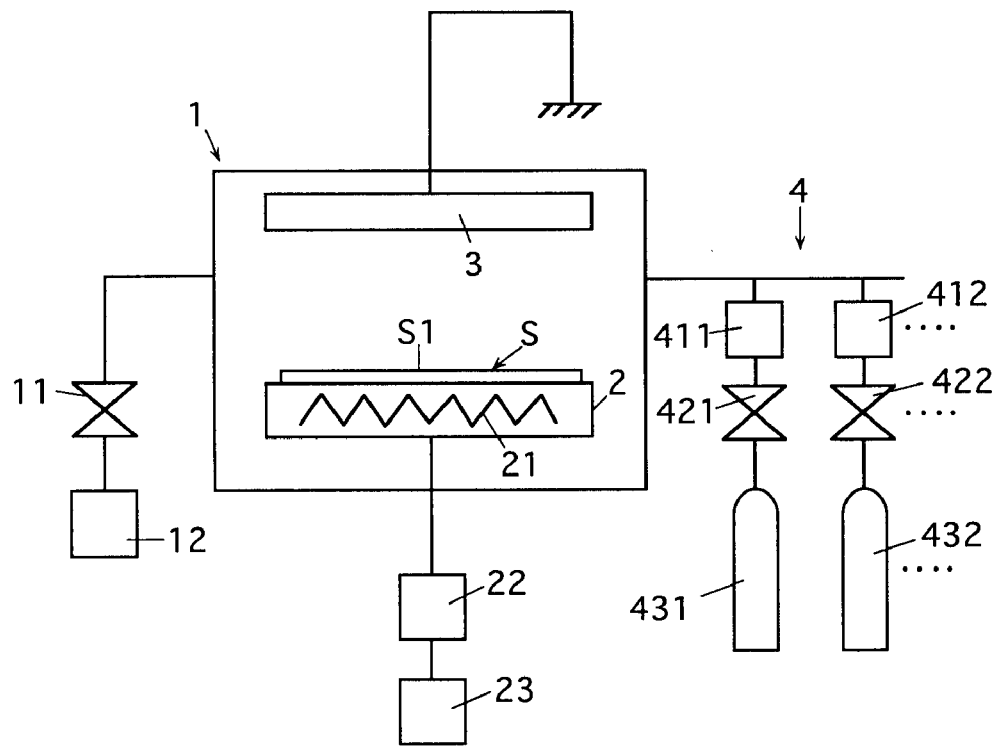
FIG. 1 shows a schematic structure of an example of a film forming device which can be utilized for manufacturing a carbon film and a carbon-film-coated object according to the invention.

The carbon film and the method of manufacturing the same as well as the carbon-film-coated object and the method of manufacturing the same according to the invention will now be described in greater detail.

First, description will now be given on a carbon film containing fluorine and hydrogen as well as matters relating to it.

Each of the carbon film described in the foregoing item (1) in [1], the carbon film in the carbon-film-coated object described in the foregoing item (1) in [2], the carbon film obtained by the carbon film forming method described in the foregoing item (1) in [3] and the carbon film formed on the object by the carbon-film-coated object manufacturing method described in the foregoing item (1) in [4] (each of which may be referred to as a "fluorine/hydrogen-containing carbon film" hereinafter), has a C—F bond portion, may be considered as a carbon film in which fluoride is mixed, and has good lubricity, good hardness and good wear resistance as a whole owing to existence of the carbon film portion having certain lubricity and harder than fluoride and the C—F bond portion having higher lubricity than the carbon film portion. Further, each film has a good hardness and a good wear resistance, and therefore peeling from the object, which may be caused due to softness, is suppressed so that the film can be formed on the base member or the film formation target object with good adhesion. The carbon-film-coated object in the item (1) of [2], which is coated with the carbon film containing fluorine and hydrogen, has good durability.

The fluorine/hydrogen-containing carbon film according to the invention requires existence of C—F bonds, but the C—F bonds which are excessively large in number reduce the hardness and the wear resistance so that the carbon film is configured to have a spectrum, determined by FT-IR (Fourier Transform Infrared) spectrum analysis, exhibiting such a relationship that a ratio (IR.C—F)/(IR.C—H) between a peak area (IR.C—F) in a range from 1000 cm$^{-1}$–1300 cm$^{-1}$ resulting from C—F bonds and a peak area (IR.C—H) in a range from 2800 cm$^{-1}$ to 3100 cm$^{-1}$ resulting from C—H bonds is larger than 0, and a spectrum, determined by XPS (X-ray photoelectron spectrum analysis), exhibiting such a relationship that a ratio ($F_{1S}/C_{1S}$) between a peak intensity resulting from $F_{1S}$ and a peak intensity resulting from $C_{1S}$ is larger than 0 and smaller than 3, as already described.

The fluorine/hydrogen-containing carbon film according to the invention may further contain nitrogen for further increasing the hardness. Alternatively, it may contain at least one of metal, metal compound (typically, metal oxide, metal nitride or metal carbide), silicon and silicon compound (typically, silicon oxide, silicon nitride or silicon carbide).

For improving adhesion to the object and achieving the intended hardness and wear resistance as well as the intended lubricity, a rate of the C—F bonds may increase or decrease continuously or stepwise in the direction of the thickness of the film. In this case, the carbon film may be configured such that the rate of the C—F bonds increases continuously or stepwise as the position moves in the direction of the thickness of the film from the side near the carbon-film-coated base member or the object body to the side remote therefrom.

The fluorine/hydrogen-containing carbon film according to the invention is required to have a predetermined hardness, and may be typically a DLC (diamond-like carbon) film.

The DLC film is superior in sliding property (lubricity) with respect to another object, wear resistance, electrical insulation, water repellency and others, and is light-transparent if it has an ordinary thickness. By adjusting the thickness, the film can be formed with good adhesion without impairing the flexibility of the base member or the object even if the base member or the object to be coated with the carbon film has a surface formed of a flexible material such as rubber or resin. By the plasma CVD method or the like, it can be formed easily at a relatively low temperature.

The method of manufacturing the carbon film described in the item (1) in [1] and the carbon film of the carbon-film-coated object described in the item (1) in [2] may be a plasma CVD method, a sputtering method, an ion plating method or the like, and particularly the plasma CVD method can provide such an advantage that the same device can be used for pretreatment with plasma to be described later and formation of the carbon film. The film forming method such as plasma CVD, sputtering, ion plating or the like can provide such an advantage that the film formation can be performed at a temperature range not thermally damaging the surface material of the carbon film formation base member or the film formation target object even when it is made of a material such as rubber or resin having a relatively low heat resistance.

For forming the carbon film by the plasma CVD method, the deposition pressure is set, e.g., to about 100 mTorr, and the deposition temperature is set to 100° C. or less, although not restricted to these values, whereby a DLC film can be formed. The higher deposition temperature increases the hardness of the film, and the temperature of 500° C. or more provides the carbon film having extremely good wear resistance. The temperature of 900° C. or more provides a diamond film.

As a typical example of the method of forming the fluorine/hydrogen-containing carbon film, the carbon film forming method described in the item (1) in [3] may be employed, and the method described in the item (1) in [4] utilizing the method described in the item (1) in [3] may be employed as a typical example of the method of manufacturing the carbon-film-coated object.

The hydrocarbon compound gas, which can be employed for forming the carbon film in these methods, may be a gas of a material such as methane ($CH_4$), ethane ($C_2H_6$), propane ($C_3H_8$), butane ($C_4H_{10}$), acetylene ($C_2H_2$), benzene ($C_6H_6$) or cyclohexane ($C_6H_{12}$), which is-generally used for carbon film formation, and the material gas may be a mixture of the above hydrocarbon compound gas and a carrier gas such as a hydrogen gas, an inert gas or the like, If necessary.

The carbon fluoride compound gas may be a tetrafluoromethane ($CF_4$) gas, a hexafluoroethane ($C_2F_6$) gas, a octafluorocyclobutane ($C_4F_8$) gas or the like. For forming the carbon film, the mixture of the hydrocarbon compound gas and the carbon fluoride compound gas may be used, whereby the lubricity of the carbon film can be improved, and further the deposition rate can be improved. Thereby, the productivity of the film can be improved. Further, film adhesion can be improved owing to reduction in film stress, and gas barrier property can be improved.

For formation of the fluorine/hydrogen-containing carbon film according to the invention, the hydrocarbon compound gas and the carbon fluoride compound gas as well as a nitrogen containing gas ($N_2$, ammonia, hydrazine or the like) may be used as the deposition material gas, whereby the fluorine/hydrogen-containing carbon film containing the nitrogen, as described above and having an improved hardness may be formed. Further, the hydrocarbon compound gas and the carbon fluoride compound gas as well as the gas forming at least one of metal, metal compound (typically, metal oxide, metal nitride or metal carbide), silicon and silicon compound (typically, silicon oxide, silicon nitride or silicon carbide) may be used as the deposition material gas for forming the fluorine/hydrogen-containing carbon film containing at least one of metal, metal compound (typically, metal oxide, metal nitride or metal carbide), silicon and silicon compound (typically, silicon oxide, silicon nitride or silicon carbide) as described above.

For mixing the oxide, nitride or carbide of silicon (Si) or metal in the film, Si-containing compound ($SiH_4$, TEOS or the like), Ti compound ($TiCl_4$, tetraethoxytitanium (Ti($OC_2H_5$)$_4$), tetraisopropoxytitanium (Ti(O-i-$C_3H_7$)$_4$) or the like) may be reacted with oxygen or the like.

Alternatively, the carbon film may be doped with sputter particles produced by sputtering of a sputter target, which are made of metal, metal compound (typically, metal oxide, metal nitride or metal carbide), silicon or silicon compound (typically, silicon oxide, silicon nitride or silicon carbide), for forming the fluorine/hydrogen-containing carbon film containing at least one of metal, metal compound (typically, metal oxide, metal nitride or metal carbide), silicon and silicon compound (typically, silicon oxide, silicon nitride or silicon carbide).

For further increasing the adhesion to the base member or the object, and satisfying both the hardness and the wear resistance as well as the lubricity in any one of the foregoing structures and methods, the mixing rate of the hydrocarbon compound gas and the carbon fluoride compound gas may be changed with time in the supply of the gases to form the carbon film configured such that the rate of the C—F bonds may increase continuously or stepwise as the position moves in the direction of the thickness of the film from the side near the carbon-film-coated base member or the object to the side remote therefrom.

For forming the fluorine/hydrogen-containing carbon film by the plasma CVD method, various devices such as a parallel-plate type plasma CVD device may be employed, and the following manner may be employed for forming the fluorine/hydrogen-containing carbon film. A deposition chamber formed of a plasma producing chamber and a plasma processing chamber connected thereto is employed as the foregoing deposition chamber, the carbon film formation base member or the film formation target object is located in the plasma processing chamber, a part of the deposition material gas is supplied into the plasma processing chamber, and the other is supplied into the plasma producing chamber. In addition to the above:

(a) plasma is formed from the gas supplied into the plasma producing chamber by application of an electric power, and the plasma is supplied into the plasma processing chamber to decompose (form plasma from) the gas supplied into the plasma processing chamber; or (b) plasma is formed from the gas supplied into the plasma producing chamber by application of an electric power, and plasma is formed from the gas supplied into the plasma processing chamber by application of an electric power, whereby
the fluorine/hydrogen-containing carbon film is formed on the base member or the object.

As more specific examples, the hydrocarbon compound gas and the carbon fluoride compound gas as well as the gas forming at beast one of metal, metal compound (typically, metal oxide, metal nitride or metal carbide), silicon and silicon compound (typically, silicon oxide, silicon nitride or silicon carbide) are used as the deposition material gas, the gas forming at least one of metal, metal compound (typically, metal oxide, metal nitride or metal carbide), silicon and silicon compound (typically, silicon oxide, silicon nitride or silicon carbide) is supplied into the plasma producing chamber, and the hydrocarbon compound gas and the carbon fluoride compound gas are supplied into the plasma processing chamber; and (a) plasma is formed from the gas supplied into the plasma producing chamber by application of an electric power, and the plasma is supplied into the plasma processing chamber to decompose (form plasma from) the gas supplied into the plasma processing chamber; or (b) plasma is formed from the gas supplied into the plasma producing chamber by application of an electric power, and plasma is formed from the gas supplied into the plasma processing chamber by application of an electric power, whereby
the fluorine/hydrogen-containing carbon film containing at least one of metal, metal compound (typically, metal oxide, metal nitride or metal carbide), silicon and silicon compound (typically, silicon oxide, silicon nitride or silicon carbide) is formed on the base member or the object.

In the invention, the deposition chamber formed of the plasma producing chamber and the plasma processing chamber connected thereto may be employed, and the plasma may be formed from the gas(es) in each of the plasma producing chamber and the plasma processing chamber by application of the electric power, in which case such an advantage can be achieved that the formation of the gas plasma in each of the plasma producing chamber and the plasma processing chamber can be controlled.

The following carbon film forming method may be employed. The deposition chamber formed of the plasma producing chamber and the plasma processing chamber connected thereto are employed, the carbon film formation base member or the film formation target object is located in the plasma processing chamber, a sputter target made of at least one of metal, metal compound (typically, metal oxide, metal nitride or metal carbide), silicon and silicon compound (typically, silicon oxide, silicon nitride or silicon carbide) is located in the plasma producing chamber, the hydrocarbon compound gas and the carbon fluoride compound gas are supplied into the plasma processing chamber, a gas for sputtering is supplied into the plasma producing chamber, and an electric power is applied to the gas for sputtering to form plasma therefrom; and (a) the plasma as well as sputter particles generated by sputtering effected on the sputter target in the plasma are supplied into the plasma processing chamber to decompose (form plasma from) the hydrocarbon compound gas and the carbon fluoride compound gas supplied into the plasma processing chamber, or (b) sputter particles generated by sputtering effected on the sputter target in the plasma are supplied into the plasma processing chamber, and plasma is also formed from the hydrocarbon compound gas and the carbon fluoride compound gas supplied into the plasma processing chamber by application of an electric power, whereby
the carbon film containing at least one of metal, metal compound, silicon and silicon compound is formed on the base member or the film formation target object.

In this case, an inert gas (e.g., argon gas) may be employed as the gas for sputtering.

Description will now be given on the carbon film containing hydrogen and nitrogen and matters relating to it as well as the carbon film containing hydrogen and at least one of metal, metal compound, silicon and silicon compound and matters relating to it.

Each of the carbon film described in the foregoing item (2) in [1], the carbon film in the carbon-film-coated object described in the foregoing item (2) in [2], the carbon film obtained by the carbon film forming method described in the foregoing item (2) in [3] and the carbon film formed on the object by the carbon-film-coated object manufacturing method described in the foregoing item (2) in [4], (each of which may be referred to as a "hydrogen/nitrogen-containing carbon film" hereinafter), has a C—N bond portion. Therefore, it has a good lubricity resulting from the carbon film portion, and has a hardness and a good wear resistance as a whole owing to existence of the carbon film portion harder than fluoride and the nitride portion having a further large hardness. Since each film has a good hardness and a good wear resistance, peeling from the object is suppressed so that the film can be formed on the base member or the target object with good adhesion. The carbon-film-coated object in the item (2) of [2], which is coated with such a carbon film containing hydrogen and nitrogen, has good durability.

For further increasing the hardness, the hydrogen/nitrogen-containing carbon film according to the invention may contain at least one of metal, metal compound (typically, metal oxide, metal nitride or metal carbide), silicon and silicon compound (typically, silicon oxide, silicon nitride or silicon carbide).

Each of the carbon film described in the foregoing item (3) in [1], the carbon film in the carbon-film-coated object described in the foregoing item (3) in [2], the carbon films obtained by the carbon film forming methods described in the foregoing items (3) and (4) in [3] and the carbon films formed on the objects by the carbon-film-coated object manufacturing methods described in the foregoing items (3) and (4) in [4], (each of which may be referred to as a "hydrogen/metal/etc-containing carbon film" hereinafter), has a good lubricity owing to existence of the carbon film portion, has a hardness and a good wear resistance as a whole owing to existence of the hard carbon film portion and at least one of metal, metal compound (typically, metal oxide, metal nitride or metal carbide), silicon and silicon compound (typically, silicon oxide, silicon nitride or silicon carbide). Since each film has a good hardness and a good wear resistance, peeling from the object is suppressed so that the film can be formed on the base member or the film formation target object with good adhesion. The carbon-film-coated object in the item (3) of [2], which is coated with the hydrogen/metal/etc-containing carbon film, has good durability.

The hydrogen/nitrogen-containing carbon film and the hydrogen/metal/etc-containing carbon film according to the invention are required to have a predetermined hardness, and may be typically a DLC (diamond-like carbon) film.

The DLC film has features already described in connection with the fluorine/hydrogen-containing carbon film.

The method of forming the hydrogen/nitrogen-containing carbon film and the hydrogen/metal/etc-containing carbon film as well as the carbon films of the carbon-film-coated objects, which are coated with these films, respectively, may be the plasma CVD method, sputtering method, ion plating method or the like, similarly to the cases for forming the fluorine/hydrogen-containing carbon film. These film forming methods can achieve the advantages already described.

As a typical example of the formation of the hydrogen/nitrogen-containing carbon film, the carbon film forming method described in the item (2) of [3] may be employed, and the method described in the item (2) of [4] utilizing the method described in the item (2) of [3] may be employed as the typical example of the method of manufacturing the carbon-film-coated object.

As a typical example of the formation of the hydrogen/metal/etc-containing carbon film, the carbon film forming methods described in the items (3) and (4) of [3] may be employed, and the methods described in the items (3) and (4) of [4] utilizing the methods described in the items (3) and (4) of [3] may be employed as the typical examples of the method of manufacturing the carbon-film-coated object.

The hydrocarbon compound gas, which can be employed for forming the carbon film in these methods, may be similar to those, which can be employed for formation of the fluorine/hydrogen-containing carbon film. If necessary, a mixture of the above hydrocarbon compound gas and a carrier gas such as a hydrogen gas, an inert gas or the like may be employed.

As the nitrogen containing gas, a gas of nitrogen ($N_2$), ammonia, hydrazine or the like may be used.

For formation of the hydrogen/nitrogen-containing carbon film, the hydrocarbon compound gas and the nitrogen containing gas as well as the gas forming at least one of metal, metal compound (typically, metal oxide, metal nitride or metal carbide), silicon and silicon compound (typically, silicon oxide, silicon nitride or silicon carbide) may be used as the deposition material gas for forming the hydrogen/nitrogen-containing carbon film containing at least one of metal, metal compound (typically, metal oxide, metal nitride or metal carbide), silicon and silicon compound (typically, silicon oxide, silicon nitride or silicon carbide).

In either of the cases of forming the hydrogen/nitrogen-containing carbon film as well as the hydrogen/metal/etc-containing carbon film, and particularly in the case of mixing the oxide, nitride or carbide of silicon (Si) or metal in the film, Si-containing compound ($SiH_4$, TEOS or the like), Ti compound ($TiCl_4$, tetraethoxytitanium ($Ti(OC_2H_5)_4$), tetraisopropoxytitanium ($Ti(O-i-C_3H_7)_4$) or the like) may be reacted with oxygen or the like.

Alternatively, the carbon film may be doped with sputter particles produced by sputtering of a sputter target, which are made of metal, metal compound (typically, metal oxide, metal nitride or metal carbide), silicon or silicon compound (typically, silicon oxide, silicon nitride or silicon carbide), for forming the hydrogen/nitrogen-containing carbon film or the hydrogen/metal/etc-containing carbon film containing at least one of metal, metal compound (typically, metal oxide, metal nitride or metal carbide), silicon and silicon compound (typically, silicon oxide, silicon nitride or silicon carbide).

For forming the hydrogen/nitrogen-containing carbon film or the hydrogen/metal/etc-containing carbon film by the plasma CVD method, various devices such as a parallel-plate type plasma CVD device may be employed, and the following manner may be employed.

A deposition chamber formed of a plasma producing chamber and a plasma processing chamber connected thereto is employed as the foregoing deposition chamber, the carbon film formation base member or the film formation target object is located in the plasma processing chamber, a part of the deposition material gas is supplied into the plasma processing chamber, and the other is supplied into the plasma producing chamber. In addition to the above:

(a) plasma is formed from the gas supplied into the plasma producing chamber by application of an electric power, and the plasma is supplied into the plasma processing chamber to decompose the gas supplied into the plasma processing chamber; or (b) plasma is formed from the gas supplied into the plasma producing chamber by application of an electric power, and plasma is formed from the gas supplied into the plasma processing chamber by application of an electric power, whereby
the hydrogen/nitrogen-containing carbon film or the hydrogen/metal/etc-containing carbon film is formed on the base member or the object.

As more specific examples of the above case for forming the hydrogen/nitrogen-containing carbon film, the hydrocarbon compound gas is supplied into the plasma processing chamber, and the nitrogen containing gas is supplied into the plasma producing chamber; and (a) plasma is formed from the nitrogen containing gas supplied into the plasma producing chamber by application of an electric power, and the plasma is supplied into the plasma processing chamber to decompose (form plasma from) the hydrocarbon compound gas supplied into the plasma processing chamber; or (b) plasma is formed from the nitrogen containing gas supplied into the plasma producing chamber by application of an electric power, and plasma is also formed from the hydrocarbon compound gas supplied into the plasma processing chamber by application of an electric power, whereby
the carbon film containing the hydrogen and nitrogen is formed on the base member or the object.

As another example of formation of the hydrogen/nitrogen-containing carbon film, the hydrocarbon compound gas and the nitrogen containing gas as well as the gas forming at least one of metal, metal compound (typically, metal oxide, metal nitride or metal carbide), silicon and silicon compound (typically, silicon oxide, silicon nitride or silicon carbide) may be used as the deposition material gas, the gas forming at least one of metal, metal compound, silicon and silicon compound- is supplied into the plasma producing chamber, and the hydrocarbon compound gas and the nitrogen containing gas are supplied into the plasma processing chamber; and (a) plasma is formed from the gas supplied into the plasma producing chamber by application of an electric power, and the plasma is supplied into the plasma processing chamber to decompose (form plasma from) the gas supplied into the plasma processing chamber; or (b) plasma is formed from the gas supplied into the plasma producing chamber by application of an electric power, and plasma is also formed from the gas supplied into the plasma processing chamber by application of an electric power, whereby
the hydrogen/nitrogen-containing carbon film containing at least one of metal, metal compound, silicon and silicon compound is formed on the base member or the object.

The following carbon film forming method may also be employed. A deposition chamber formed of a plasma producing chamber and a plasma processing chamber connected thereto is employed as the foregoing deposition chamber, the carbon film formation base member or the film formation target object is located in the plasma processing chamber, and a sputter target made of at least one of metal, metal compound (typically, metal oxide, metal nitride or metal carbide), silicon and silicon compound (typically, silicon oxide, silicon nitride or silicon carbide) is located in the plasma producing chamber, and the hydrocarbon compound gas and the nitrogen containing gas are supplied into the plasma processing chamber; and (a) a gas for sputtering is supplied into the plasma producing chamber, an electric power is applied to the gas for sputtering to form plasma therefrom, the plasma as well as sputter particles generated by sputtering effected on the sputter target in the plasma are supplied into the plasma processing chamber to decompose (form plasma from) the hydrocarbon compound gas and nitrogen containing gas supplied into the plasma processing chamber, or (b) a gas for sputtering is supplied into the plasma producing chamber, plasma is formed from the gas in the plasma producing chamber by application of an electric power, sputter particles generated by sputtering effected on the sputter target in the plasma are supplied into the plasma processing chamber, and plasma is also formed from the hydrocarbon compound gas and nitrogen containing gas supplied into the plasma processing chamber by application of an electric power, whereby
the carbon film containing at least one of metal, metal compound, silicon and silicon compound is formed on the base member or the film formation target object.

In this case, an inert gas (e.g., argon gas) may be employed as the gas for sputtering.

As an example of formation of the hydrogen/metal/etc-containing carbon film, a deposition chamber formed of a plasma producing chamber and a plasma processing chamber connected thereto is employed as the foregoing deposition chamber, the carbon film formation base member or the film formation target object is located in the plasma processing chamber, the gas forming at least one of metal, metal compound, silicon and silicon compound is supplied into the plasma producing chamber, and the hydrocarbon compound gas is supplied into the plasma processing chamber; and (a) plasma is formed from the gas supplied into the plasma producing chamber by application of an electric power, and the plasma is supplied into the plasma processing chamber to decompose (form plasma from) the gas supplied into the plasma processing chamber; or (b) plasma is formed from the gas supplied into the plasma producing chamber by application of an electric power, and plasma is also formed from the gas supplied into the plasma processing chamber by application of an electric power, whereby the carbon film containing at least one of metal, metal compound, silicon and silicon compound is formed on the base member or the object.

Each of the foregoing fluorine/hydrogen-containing carbon film, hydrogen/nitrogen-containing carbon film and hydrogen/metal/etc-containing carbon film contains hydrogen to improve the slidability thereof.

In any one of the foregoing fluorine/hydrogen-containing carbon film, hydrogen/nitrogen-containing carbon film and hydrogen/metal/etc-containing carbon film, either of a DC power and a high-frequency power can be used as the electric power for plasma formation. When using the high-frequency power, such a high-frequency power may be employed that is prepared by effecting amplitude modulation at a predetermined modulation frequency on a basic high-frequency power of a predetermined frequency. In this case, the basic high-frequency power of the predetermined frequency (e.g., of 13.56 MHz) is subjected to the amplitude modulation at the modulation frequency of $1/100000$–$1/10$ of the predetermined frequency of the basic power.

By using such a modulated high-frequency power as the power for forming the plasma from the deposition material gas, the produced plasma can have a high density, and thereby a rate of reaction is improved so that deposition can be performed at a low temperature. By effecting the modulation as described above, the reaction is promoted on the outer surface of the film formation base member or the film formation target object so that the film adhesion can be improved, and the deposition rate can be improved. Thereby, the productivity of the film can be improved.

The basic high-frequency power before the modulation may have a waveform such as a sinusoidal, square, sawtooth-like or triangular form. The amplitude modulation may be pulse modulation conducted by on/off of the power supply, or may be another modulation in the form of pulse.

The basic high-frequency power has a frequency of 13.56 MHz or more, although not restricted thereto. The frequency lower than the above tends to cause an insufficient plasma density. The frequency of the basic high-frequency may be, e.g., about 500 MHz or less in view of a cost of the high-frequency power source and others.

The modulation frequency may be in the foregoing range because a modulation frequency smaller than $1/100000$ of the frequency of the basic high-frequency power significantly lowers the deposition rate. The modulation frequency larger than $1/10$ makes the matching difficult, and lowers the uniformity in film thickness.

In any one of the foregoing cases, the duty ratio ((on-time)/(on-time+off-time)) of the modulation may be in a range from about 5% to about 90%. The duty ratio lower than 5% would lower the deposition rate. The duty ratio larger than 90% would excessively increase the power supply time, and therefore would reduce the effect of improving the plasma density which could be achieved by the modulated high-frequency power.

For any one of the foregoing fluorine/hydrogen-containing carbon film, the hydrogen/nitrogen-containing carbon film and the hydrogen/metal/etc-containing carbon film, such a pretreatment may be performed prior to the carbon film formation that the film formation surface of the base member or the film formation target object is exposed to plasma of at least one of fluorine containing gas, hydrogen gas and oxygen gas.

The above fluorine-containing gas may be a fluorine ($F_2$) gas, a nitrogen trifluoride ($NF_3$) gas, a sulfur hexafluoride ($SF_6$) gas, a tetrafluoromethane ($CF_4$) gas, a hexafluoroethane ($C_2F_6$) gas, a octafluorocyclobutane ($C_4F_8$) gas, a silicon tetrafluoride ($SiF_4$) gas, a disilicon hexafluoride ($Si_2F_6$) gas, a chlorine trifluoride ($ClF_3$) gas, a hydrogen fluoride (HF) gas or the like.

By exposing the film formation surface of the film formation base member or the film formation target object to the plasma of the pretreatment gas, the film formation surface is cleaned, and the surface roughness of the film formation surface is improved. These contribute to improvement of the adhesion of the carbon film so that the carbon film having high adhesion can be obtained.

If the fluorine containing gas plasma is employed for the film formation surface of the film formation base member or the film formation target object, which is made of an organic material such as rubber or resin, the plasma can conduct a termination treatment on the film formation surface with the fluorine. If the hydrogen gas plasma is employed for the same, the plasma can conduct a termination treatment on the film formation surface with the hydrogen. Since the fluorine-carbon bond and the hydrogen-carbon bond are stable, the carbon atoms in the film form stable bonds with the fluorine atoms or hydrogen atoms at the surface portion of the base member or the film formation target object when the carbon film is formed on the surface subjected to such termination treatment. This improves the adhesion of the carbon film, which will be formed later, to the base member or the like.

When employing the oxygen gas plasma, smear due to, e.g., organic matters adhering to the film formation surface can be removed particularly effectively so that the adhesion of the carbon film to be formed subsequently can be improved.

In the method according to the invention, the pretreatment using plasma may be performed several times with the same kind of plasma or with different kinds of plasma. For example, if the film formation surface is exposed to the fluorine-containing gas plasma or hydrogen gas plasma after exposing the film formation surface to the oxygen gas plasma, and the carbon film is subsequently deposited thereon, the fluorine or hydrogen termination is performed at the surface after the surface is cleaned so that the carbon film deposited thereafter has a very good adhesion to the film formation surface.

In the carbon film coated object and the object (film formation target object) in the manufacturing method thereof according to the invention, at least the surface coated with the carbon film may be made of rubber and/or resin, and at least the surface coated with the carbon film may be made of metal and/or ceramics (ceramic material).

The rubber may be, e. g., natural rubber, butyl rubber, ethylene-propylene rubber, chloroprene rubber, chlorinated polyethylene rubber, epichlorohydrin rubber, acrylic rubber, nitrile rubber, urethane rubber, silicone rubber, fluororubber or the like.

The resin may be either a thermosetting resin or thermoplastic resin.

The thermosetting resin may be, e.g., phenol-formaldehyde resin, urea resin, melamine-formaldehyde resin, epoxy resin, furan resin, xylene resin, unsaturated polyester resin, silicone resin, diallyl phthalate resin or the like.

The thermoplastic resin may be, e. g., vinyl resin (polyvinyl chloride, polyvinyl butyrate, polyvinyl alcohol, polyvinyl acetate, polyvinyl formal, polyvinyl dichloride or the like), polyvinylidene chloride, chlorinated polyether, polyester resin (polystyrene, styrene-acrylonitrile copolymer or the like), ABS, polyethylene, polypropylene, polyacetal, acrylic resin [poly(methyl methacrylate), modified acrylic resin or the like], polyamide resin (nylon 6, 66, 610, 11 or the like), cellulose resin (ethyl cellulose, acetyl cellulose, propyl cellulose, cellulose acetate butyrate, cellulose nitrate or the like), polycarbonate, phenoxy resin, fluorine-containing resin (resin formed of chlorotrifluoro ethylene, ethylene tetrafluoride, ethylene tetrafluoride, propylene hexafluoride, vinylidene fluoride or the like), or polyurethane or the like.

The metal may be, e. g., stainless steel, hard metal carbide such as WC, high-speed steel, aluminum, aluminum alloy or the like, and the ceramics (ceramic material) may be alumina, silicon nitride, aluminum nitride or the like.

The object in the carbon-film-coated object according to the invention is not particularly restricted, provided that the carbon film according to the invention can be formed. Various objects including objects exemplified below can be the targets for the carbon film formation according to the invention.

Various objects made of metal or ceramics such as machine tool parts, dies, jigs, parts (e.g., gears, slide parts and others) of vehicles, aircraft and ships, parts (e.g., wafer carrier transporting arms, various rails) of ion implanting devices, deposition devices, etching devices or the like for semiconductor device manufacturing, kitchen appliances (pans and others), kitchen goods (pans, frying pans and others), bath facilities and goods (hot water tap parts and others), sanitary facilities and goods, containers and other.

Various objects made of rubber such as machine tool parts, parts of vehicles, aircraft, ships and others (e.g., vibration damper rubber parts used in drives including engines, stirring portions, exhaust portions, body connections, suspensions as well as rubber hoses used in fuel systems, air systems, lubricating oil systems, brake systems, air-conditioning systems, cooling water systems and others; wipers, various sealing parts, various liquid-tight caps and others of automobiles)

Various objects made of resin such as machine tool parts (e.g., gears, slide parts and others), jigs, electric parts (insulators, terminals and others), parts of vehicles, aircraft and ships (e.g., fuel tanks, bodies and others of automobiles), kitchen appliances, kitchen goods, bath facilities and goods, sanitary facilities and goods, films, sheets, recording disks, nets for fishery and others, clothing parts such as buttons, toys and their parts, ornaments, stationeries and their parts, sport goods and their parts, and household goods and their parts (containers such as casing, their parts, and tableware).

Embodiments of the invention will now be described with reference to the drawings.

FIG. 1 shows a schematic structure of an example of a film forming device which can be used for manufacturing a carbon film and a carbon-film-coated object according to the invention.

The device in FIG. 1 is a plasma CVD device, which includes a vacuum chamber 1 (an example of a deposition chamber) connected to a vacuum pump 12 via a pressure control value 11, and also includes electrodes 2 and 3, which are opposed to each other, and are arranged in the vacuum chamber 1. The electrode 3 is grounded, and the electrode 2 is connected to a high-frequency or radio-frequency power source 23 via a matching box 22. A heater 21 for heating a film formation target object S, which is held on the electrode 2, is arranged on the electrode 2. A gas supply portion 4 is connected to the chamber 1 for supplying a film formation or deposition material gas into the chamber 1. The gas supply portion 4 includes one or more gas sources 431, 432, . . . for the deposition material gas connected to the chamber 1 via mass-flow controllers 411, 412, . . . and valves 421, 422, . . . .

Description will now be given on a method of manufacturing the carbon-film-coated object according to the invention by the above device.

First, a deposition or film formation target object S of a predetermined material (a rubber plate for a vibration damper in this example) is placed on the high-frequency electrode 2 in the chamber 1 with its film formation surface opposed to the electrode 3, and the exhaust pump 12 operates to reduce the inner pressure of the chamber 1 to a predetermined value. The gas supply portion 4 supplies a pretreatment gas formed of at least one of a fluorine containing gas, a hydrogen containing gas and an oxygen containing gas into the chamber 1, and the high-frequency power source 23 supplies a high-frequency power to the electrode 2 via the matching box 22 so that plasma is formed from the pretreatment gas thus supplied, and a pretreatment is effected on the film formation surface S1 of the object S in the plasma. This surface treatment (pretreatment) is desired, but is not essential.

Therefore, if necessary, the gas is discharged from the chamber 1 for further control of the pressure, and the gas supply portion 4 supplies the deposition material gas into the chamber 1.

The deposition material gas thus supplied includes a hydrocarbon compound gas and a carbon fluoride compound gas when a fluorine/hydrogen-containing carbon film is to be formed. When a hydrogen/nitrogen-containing carbon film is to be formed, it contains a hydrocarbon compound gas and a nitrogen containing gas. When a hydrogen/metal/etc-containing carbon film is to be formed, it contains hydrocarbon compound gas and a gas forming at least one of metal, metal compound, silicon and silicon compound.

Figure 4:
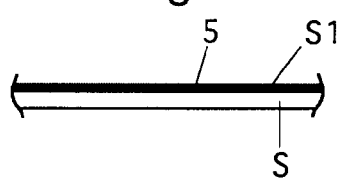
FIG. 4 is a cross section of an example of the carbon-film-coated object according to the invention.

The high-frequency power source 23 supplies a high-frequency power to the electrode 2 via the matching box 22 so that plasma is formed from the gas thus supplied, and a carbon film 5 is formed on the film formation surface S1 of the object S. The carbon film 5 on the carbon-film-coated object S (see FIG. 4) obtained in this manner is the fluorine/hydrogen-containing carbon film, when the hydrocarbon compound gas and the carbon fluoride compound gas are used as the deposition gas. The carbon film 5 is the hydrogen/nitrogen-containing carbon film, when the hydrocarbon compound gas and the nitrogen containing gas are used as the deposition gas. The carbon film 5 is the hydrogen/metal/etc-containing carbon film, when the hydrocarbon compound gas and the gas containing at least one of the metal, metal compound, silicon and silicon compound are used.

Further description will be given on the case of forming the fluorine/hydrogen-containing carbon film. For supplying the hydrocarbon compound gas and the carbon fluoride compound gas into the vacuum chamber 1 for forming the carbon film, a mixing ratio (a ratio between supply flow amounts or rates) of these gases is controlled to provide the carbon film 5 (DLC film in this embodiment), in which a spectrum, determined by FT-IR (Fourier Transform Infrared) spectrum analysis, exhibits such a relationship that a ratio (IR.C—F)/(IR.C—H) between a peak area (IR.C—F) in a range from 1000 cm$^{-1}$–1300 cm$^{-1}$ resulting from C—F bonds and a peak area (IR.C—H) in a range from 2800 cm$^{-1}$ to 3100 cm$^{-1}$ resulting from C—H bonds is larger than 0, and a spectrum, determined by XPS (X-ray photoelectron spectrum analysis), exhibits such a relationship that a ratio ($F_{1S}/C_{1S}$) between a peak intensity resulting from $F_{1S}$ and a peak intensity resulting from $C_{1S}$ is larger than 0 and smaller than 3.

This carbon film has the characteristics of the DLC film already described, has good adhesion to the object S, sufficient hardness and good wear resistance, and also has good sliding and lubricating properties with respect to another object owing to provision of the C—F bond portion.

Further description will be given on the case of forming the hydrogen/nitrogen-containing carbon film. For supplying the hydrocarbon compound gas and the nitrogen containing gas into the vacuum chamber 1 for forming the carbon film, a mixing ratio (a ratio between supply flow amounts or rates) of these gases is controlled to provide the carbon film (DLC film in this embodiment), in which an amount of the C—N bond portion is controlled.

This carbon film has the characteristics of the DLC film already described, has good adhesion to the object S, a sufficient hardness and good wear resistance, and also has good lubricity owing to a DLC film portion as well as high hardness owing to provision of the DLC film portion and the C—N bond portion.

Further description will be given on the case of forming the hydrogen/metal/etc-containing carbon film. For supplying the hydrocarbon compound gas and the gas containing at least one of the metal, metal compound, silicon and silicon compound into the vacuum chamber 1 for forming the carbon film, a mixing ratio (a ratio between supply flow amounts or rates) of these gases is controlled to provide the carbon film (DLC film in this embodiment), in which the foregoing metal or the like is dispersed.

This carbon film has the characteristics of the DLC film already described, has good adhesion to the object S, a sufficient hardness and good wear resistance, and also has good lubricity owing to a DLC film portion as well as high hardness owing to provision of the DLC film portion and the metal portion or the like.

Figure 2:
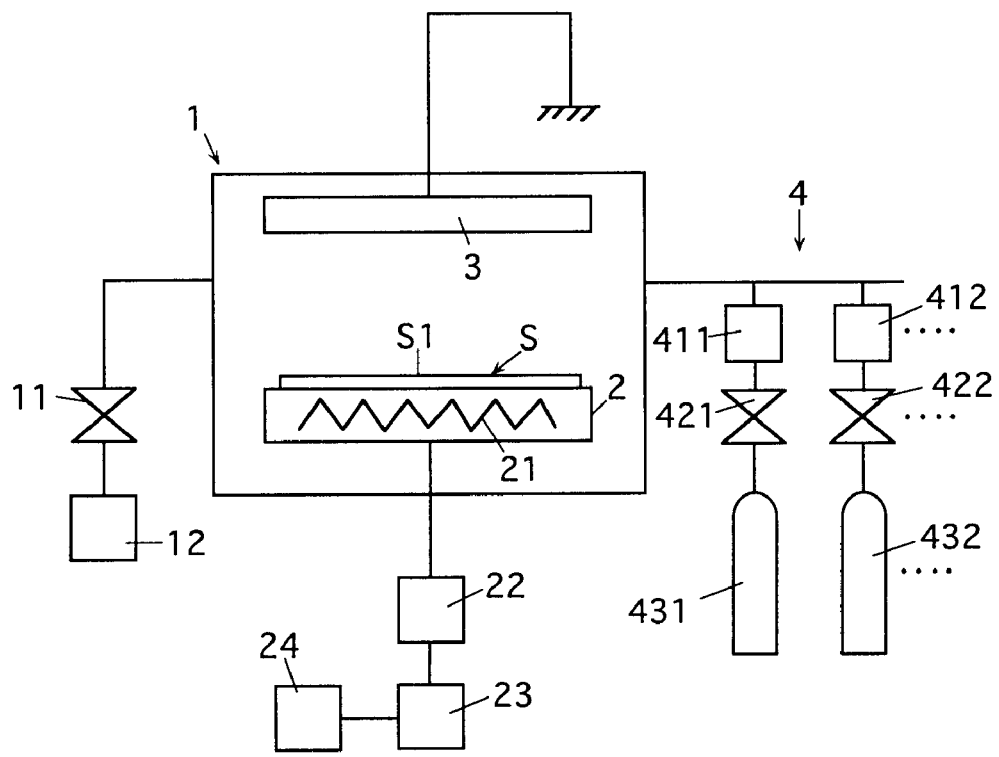
FIG. 2 shows a schematic structure of another example of the film forming device which can be utilized for manufacturing the carbon film and the carbon-film-coated object according to the invention.

Referring to FIG. 2, description will now be given on another example of the film forming device, which can be used for forming the carbon film and manufacturing the carbon-film-coated object according-to the invention.

A film forming device shown in FIG. 2 is also a plasma CVD device. This device is the same as the device shown in FIG. 1 except for that an arbitrary waveform generating device 24 is connected to the high-frequency power source 23, and the same parts as those in the device shown in FIG. 1 bear the same reference numbers.

For forming the film on the outer surface of the film formation target object S by this device, a pulse-modulated high-frequency power, which is prepared by the high-frequency power source 23 and the arbitrary waveform generating device 24, is supplied to the inner electrode 2 via the matching box 22 so that plasma is formed from the deposition material gas.

The pulse-modulated high-frequency power is prepared by effecting modulation on a basic high-frequency power having a predetermined frequency of 13.56 MHz or more with a predetermined modulation frequency in a range from $\frac{1}{100000}$ to $\frac{1}{10}$ of the predetermined frequency of the basic high-frequency power. The duty ratio ((on-time)/(on-time+ off-time)) is in a range from about 10% to about 90%. Operations other than the above are similar to those for the film formation by the device shown in FIG. 1.

The film formation by the device shown in FIG. 2 provides the carbon-film-coated object similar to that formed by the device shown in FIG. 1. Since the high-frequency power subjected to the pulse modulation is used as the electric power to be supplied for forming the plasma from the deposition material gas, the plasma of a high density is obtained so that the reaction rate is improved, and the film deposition at a low temperature can be performed. The modulation described above promotes the reaction on the object surface, and thereby can improve the film adhesion and the deposition rate.

Figure 3:
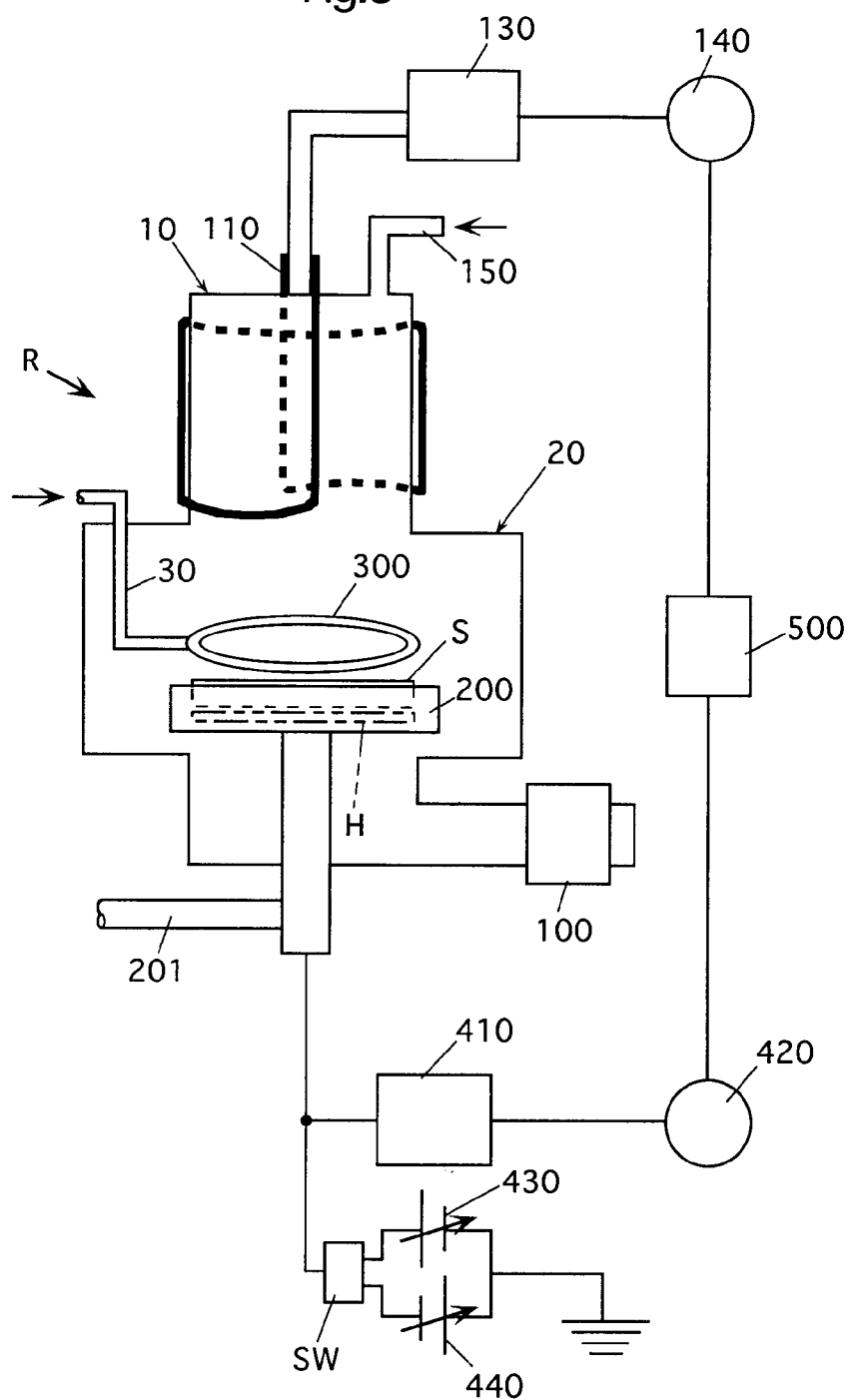
FIG. 3 shows a schematic structure of still another example of the film forming device which can be utilized for manufacturing the carbon film and the carbon-film-coated object according to the invention.

A plasma CVD device shown in FIG. 3 can be employed for the carbon film formation and the manufacturing of the carbon-film-coated object according to the invention.

The plasma CVD device shown in FIG. 3 includes a cylindrical plasma producing chamber 10 and a cylindrical plasma processing chamber 20. These form a vacuum chamber R (an example of the deposition chamber). These chambers 10 and 20 are concentrically and continuously arranged in the upper and lower positions, respectively.

An RF coil 110 in the form of an antenna is arranged along the outer peripheral wall of the plasma producing chamber 10. The antenna 110 is connected to a high-frequency or radio-frequency power source (RF power source) 140 of 13.56 MHz via a matching box 130.

A holder 200 holding the film formation target object S, which is arranged in a lower portion of the chamber 20, is arranged in the plasma processing chamber 20, and an exhaust device 100 is connected to the portion under the holder 200.

The plasma producing chamber 10 is connected to a gas supply pipe 150, which is connected to a gas supply portion (not shown). A gas supply pipe 30 is arranged in a position slightly lower than a boundary between the plasma producing chamber 10 and the plasma processing chamber 20. The gas supply pipe 30 is connected to a gas jet pipe 300 in the form of an endless ring, and is also connected to a gas supply portion located outside the chamber, although not shown. The gas jet pipe 300 is arranged in a position opposed to the object S, and is provided with a large number of equally spaced gas nozzles, which are directed toward the holder 200.

The gas jet pipe 300 is not essential.

The holder 200 is cooled by cooling water, which circulates through a water-cooling pipe 201, or is heated by a heater H arranged within the holder, if necessary.

The holder 200 is connected to a high-frequency or radio-frequency power source (RF power source) 420 via a matching box 410, and is further connected to DC power sources 430 and 440. A selector switch SW can selectively connect the power sources 430 and 440 to the holder 200 when necessary. When the object S arranged on the holder 200 and deposition species are electrically conductive, supplied plasma can be controlled by the DC power source 430 or 440 to achieve fast film deposition. When the object S and the deposition species are not electrically conductive, the high-frequency power source 420 can be used so that fast deposition may be achieved.

The high-frequency power sources 140 and 420 are connected via a phase shifter 500.

When employing this film deposition device, a part of the deposition material gas for forming the carbon film is supplied into the plasma processing chamber 20, and the remaining portion of the gas is supplied into the plasma producing chamber 10. Plasma is formed from the gas supplied into the plasma producing chamber 10 by a high-frequency induction field, which is formed by applying the high-frequency power to the antenna 110 from the high-frequency power source 140. The plasma thus formed is supplied into the plasma processing chamber 20. The plasma supplied into the plasma processing chamber 20 decompose the gas in the plasma processing chamber 20 to form the carbon film.

By appropriately selecting the output of the power source 420, a high-frequency power may be applied to the holder 200 from the power source for positively decomposing (forming plasma from) the gas in the plasma processing chamber 20. Thereby, it is possible to control both the gas plasma formation in the plasma producing chamber 10 and the gas plasma formation in the plasma processing chamber 20.

In any one of the cases of forming the carbon films or the carbon-film-coated objects by the film forming devices shown in FIGS. 1 to 3, the carbon film may be the fluorine/hydrogen-containing carbon film, and may be required to have a further increased hardness. In this case, a nitrogen containing gas is employed in addition to the hydrocarbon compound gas and the carbon fluoride compound gas described above as the deposition material gas for the carbon film formation, and are supplied into the chamber I or R. Thereby, the carbon film thus formed contains nitrogen in addition to the fluorine and hydrogen, and therefore has a further increased hardness.

Alternatively, a gas forming desired one or more of metal, metal compound (e.g., metal oxide, metal nitride or metal carbide), silicon and silicon compound (e.g., silicon oxide, silicon nitride or silicon carbide) may be supplied into the chamber I or R for the carbon film formation so that the carbon film formed in the above manner may contain, in addition to fluorine and hydrogen, one or more of the metal, metal compound (e.g., metal oxide, metal nitride or metal carbide), silicon and silicon compound (e.g., silicon oxide, silicon nitride or silicon carbide), and therefore may have a further increased hardness.

When the gas forming one or more of the metal, metal compound, silicon and silicon compound is employed as a further deposition material gas, the device shown in FIG. 3 is employed, the gas can be supplied into the plasma producing chamber 10, and the hydrocarbon compound gas and carbon fluoride compound gas can be supplied into the plasma processing chamber 20. Thereby, the plasma directly affecting the carbon film formation and the plasma affecting the doping with metal or the like can be controlled independently of each other so that such advantage that the amount of metal or the like for doping and the film quality can be controlled independently of each other as well as other advantage(s) can be achieved.

In any one of the cases of forming the carbon films or the carbon-film-coated objects by the film forming devices shown in FIGS. 1 to 3, the carbon film may be the hydrogen/nitrogen-containing carbon film, and may be required to have a further increased hardness. In this case, a gas forming desired one or more of metal, metal compound (e.g., metal oxide, metal nitride or metal carbide), silicon and silicon compound (e.g., silicon oxide, silicon nitride or silicon carbide) may be supplied into the chamber I or R for the carbon film formation so that the carbon film formed in the above manner may contain, in addition to fluorine and nitrogen, one or more of the metal, metal compound (e.g., metal oxide, metal nitride or metal carbide), silicon and silicon compound (e.g., silicon oxide, silicon nitride or silicon carbide), and therefore may have a further increased hardness.

When the gas forming one or more of the metal, metal compound, silicon and silicon compound is employed as a further deposition material gas, the device shown in FIG. 3 is employed, the gas is supplied into the plasma producing chamber 10, and the hydrocarbon compound gas and nitrogen containing gas are supplied into the plasma processing chamber 20. Thereby, the film quality can be controlled more easily.

In the case of forming the hydrogen/metal/etc-containing carbon film, the gas forming the metal or the like may be supplied into the plasma producing chamber 10, and the hydrocarbon compound gas may be supplied into the plasma processing chamber 20.

In the case of forming the hydrogen/nitrogen-containing carbon film, the nitrogen containing gas may be supplied into the plasma producing chamber 10, and the hydrocarbon compound gas may be supplied into the plasma processing chamber 20.

Figure 14A:
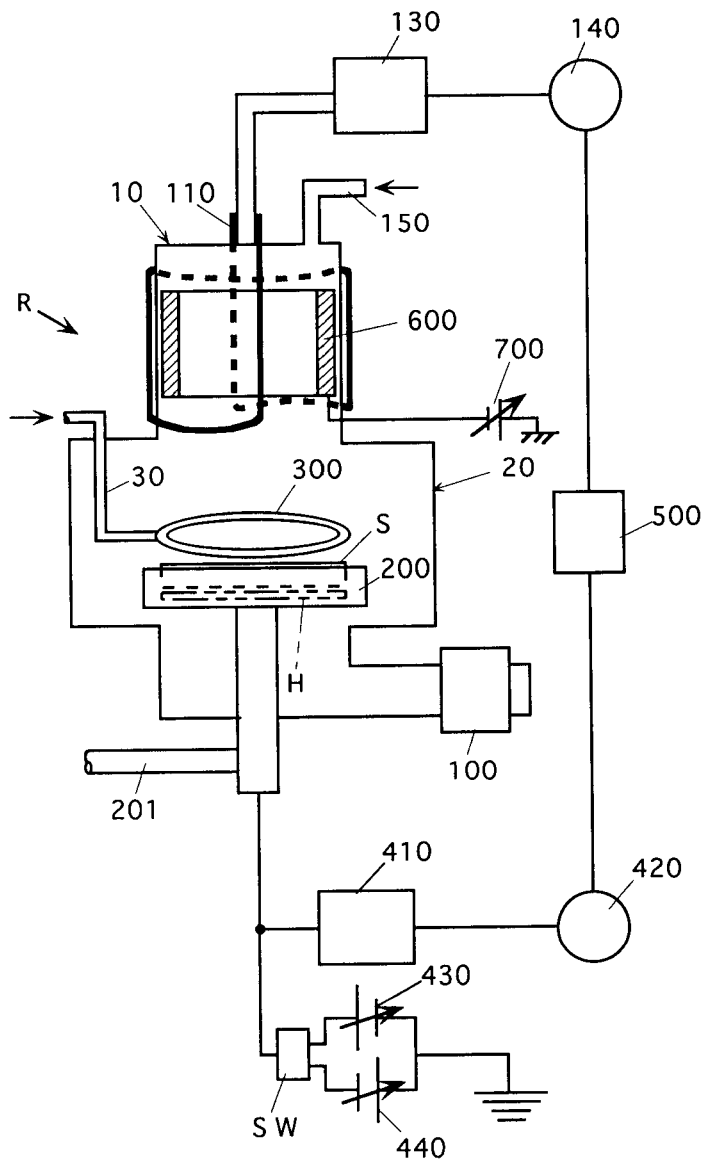
FIG. 14(A) shows a schematic structure of another example of the film forming device which can be utilized for manufacturing the carbon film and the carbon-film-coated object according to the invention.

The plasma CVD device shown in FIG. 14(A) may be employed for the carbon film formation and the manufacturing of the carbon-film-coated object according to the invention.

The plasma CVD device shown in FIG. 14(A) differs from the plasma CVD device shown in FIG. 3 in that a sputter target 600 is arranged in the plasma producing chamber 10, and a bias DC power source 700 for target sputtering is connected to the target 600. Structures other than the above are similar to those of the device shown in FIG. 3, and the same parts bear the same reference numbers. As the electrode for forming plasma from the gas in the plasma producing chamber, the antenna 110 shown in FIG. 14(A) may be replaced with a high-frequency electrode 111 and a ground electrode 112, which are arranged outside the plasma producing chamber 10, as shown in FIG. 14(B).

Figure 14B:
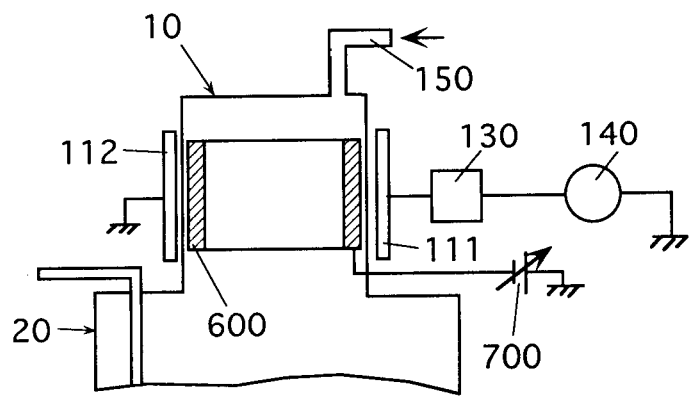
FIG. 14(B) shows another example of an electrode for applying a plasma formation power in the device shown in FIG. 14(A).

The sputter target employed in the film forming device shown in FIG. 14(A) or FIG. 14(B) may be made of one or more of doping materials such as metal, metal compound (e.g., metal oxide, metal nitride or metal carbide), silicon and silicon compound (e.g., silicon oxide, silicon nitride or silicon carbide), and more specifically, may be made of titanium, silicon, carbon, aluminum, copper, iron, chrome, titanium nitride, boron nitride, chrome nitride and/or titanium oxide.

In the film forming device shown in FIG. 14(A), when the fluorine/hydrogen-containing carbon film is to be formed, the hydrocarbon compound gas and the carbon fluoride compound gas are supplied into the plasma processing chamber 20. When hydrogen/nitrogen-containing carbon film is to be formed, the hydrocarbon compound gas and the nitrogen containing gas are supplied into the plasma processing chamber 20. When forming the hydrogen/metal/etc-containing carbon film, the hydrocarbon compound gas is supplied into the plasma processing chamber 20. In any one of these cases, a gas such as an inert gas for sputtering is supplied into the plasma producing chamber 10, and a high-frequency induction field is formed by supply of a high-frequency power to the antenna 110 from the high-frequency power source 140 to form plasma from this sputtering gas (or the plasma is formed by applying the high-frequency power to the high-frequency electrode 111 from the high-frequency power source 140). The plasma and the sputter particles, which are generated by the sputtering effected on the sputter target 600 in the plasma, are supplied into the plasma processing chamber 20 to decompose the hydrocarbon compound gas and carbon fluoride compound gas, the hydrocarbon compound gas and nitrogen containing gas, or the hydrocarbon compound gas so that the carbon film containing one or more of the metal, metal compound, silicon and the silicon compound can be formed on the object S. Naturally, a high-frequency power may be applied to the holder 200 from an appropriate output power source 420 to decompose (form plasma from) positively the gas in the plasma processing chamber 20.

When forming the fluorine/hydrogen-containing carbon film, the nitrogen containing gas may be added to the deposition material gas used in the device shown in FIG. 14(A).

In any one of the film forming devices shown in FIGS. 1 to 3 and FIGS. 14(A) and 14(B), a mixing ratio (supply flow amount ratio) between the hydrocarbon compound gas and the carbon fluoride compound gas supplied into the chambers I or R, in the formation of the fluorine/hydrogen-containing carbon film, may be changed with time to form the carbon film, in which the rate of C—F bonds increases continuously or stepwise in the direction of the film thickness as the position moves from the side near the surface of the object S toward the remote side. This carbon film has a high hardness and good sliding and lubricating properties as a whole, and has good adhesion to the film formation target object.

Description will now be given on several experimental examples relating to formation of the carbon film containing fluorine and hydrogen, formation of the carbon film containing hydrogen and nitrogen, and formation of the carbon film containing hydrogen and metal compound. In these experiments, the carbon films are formed after effecting a pretreatment on the film formation base member and object with plasma of pretreatment gases. First, description will be given on an experiment, which was performed for confirming an effect by the pretreatment, and thereafter description will be given on the carbon films containing fluorine and hydrogen, and others.

In the experiments for confirming the effect of the pretreatment, the device in FIG. 1 was used, a DLC film was formed without effecting a pretreatment on the surface of the film formation target object (experiment X-1), a DLC film was formed on the surface of the film formation target object after effecting a pretreatment on the surface (experiments X-2–X-5), and adhesion and others of these DLC films were evaluated. All the film formation target objects were made of EPDM (ethylene-propylene rubber), and had the same diameter of 20 cm and the same thickness of 10 mm. The electrode of the device had sizes of 40 cm×40 cm (square).

EXPERIMENTAL EXAMPLE X-1

Deposition Conditions
Deposition material gas: methane ($CH_4$) gas, 100 sccm
High-frequency power: frequency 13.56 MHz, 300 W
Deposition pressure: 0.1 Torr
Deposition temperature: room temperature
Deposition rate: 100 Å/minute
Deposition time: 60 minutes

EXPERIMENTAL EXAMPLE X-2

Prior to formation of the DLC film, the pretreatment was effected on an object with hydrogen gas plasma under the following conditions, and then a DLC film was formed after discharging the pretreatment-gas. The deposition conditions were the same as those in the experimental example X-1.
Pretreatment Conditions
Pretreatment gas: hydrogen ($H_2$), 100 sccm
High-frequency power: frequency 13.56 MHz, 300 W
Pretreatment pressure: 0.1 Torr
Pretreatment time: 5 minutes

EXPERIMENTAL EXAMPLE X-3

Prior to formation of the DLC film, the pretreatment was effected on an object with carbon fluoride compound gas plasma under the following conditions, and then a DLC film was formed after discharging the pretreatment gas. The deposition conditions were the same as those in the experimental example X-1.
Pretreatment Conditions
Pretreatment gas: sulfur hexafluoride ($SF_6$), 100 sccm
High-frequency power: frequency 13.56 MHz, 300 W
Pretreatment pressure: 0.1 Torr
Pretreatment time: 5 minutes

EXPERIMENTAL EXAMPLE X-4

Prior to formation of the DLC film, a first pretreatment was effected on an object with oxygen gas plasma under the following conditions, then a second pretreatment was effected on the object with hydrogen gas plasma under the following conditions, and then a DLC film was formed after discharging the pretreatment gas. The deposition conditions were the same as those in the experimental example X-1.
First Pretreatment Conditions
Pretreatment gas: oxygen ($O_2$), 100 sccm
High-frequency power: frequency 13.56 MHz, 300 W
Pretreatment pressure: 0.1 Torr
Pretreatment time: 5 minutes
Second Pretreatment Conditions
Pretreatment gas: hydrogen ($H_2$), 100 sccm
High-frequency power: frequency 13.56 MHz, 300 W
Pretreatment pressure: 0.1 Torr
Pretreatment time: 5 minutes

EXPERIMENTAL EXAMPLE X-5

Prior to formation of the DLC film, a first pretreatment was effected on an object with oxygen gas plasma under the following conditions, then a second pretreatment was effected on the object with carbon fluoride compound gas plasma under the following conditions, and then a DLC film was formed after discharging the pretreatment gas. The deposition conditions were the same as those in the experimental example X-1.
First Pretreatment Conditions
Pretreatment gas: oxygen ($O_2$), 100 sccm
High-frequency power: frequency 13.56 MHz, 300 W
Pretreatment pressure: 0.1 Torr
Pretreatment time: 5 minutes
Second Pretreatment Conditions
Pretreatment gas: sulfur hexafluoride ($SF_6$), 100 sccm
High-frequency power: frequency 13.56 MHz, 300 W
Pretreatment pressure: 0.1 Torr
Pretreatment time: 5 minutes
Then, evaluation was made on the adhesion of each of the films in the DLC-film-coated objects, which were obtained in the experimental examples X-1–X-5. The film adhesion was evaluated in such a manner that a columnar member of 5 mm in diameter was joined to the surface of the film on the object with adhesive, and was pulled vertically, and the evaluation was made based on a pulling force required for peeling off the film. The results are shown in the following table.

|  | Film Adhesion |
|---|---|
| Experimental Example X-1 | 2 kg/mm$^2$ |
| Experimental Example X-2 | 4 kg/mm$^2$ |
| Experimental Example X-3 | 4 kg/mm$^2$ |
| Experimental Example X-4 | 5 kg/mm$^2$ |
| Experimental Example X-5 | 5 kg/mm$^2$ |

As can be seen from the above, the pretreatment, which is effected on the object surface with plasma prior to the DLC film formation, can improve the film adhesion.

Evaluation was also made on the wear resistance of the surface (DLC film portion) of each of the DLC-film-coated objects obtained by the experimental examples X-1–X-5. Also, the wear resistance of the surface of the objects (unprocessed objects) not coated with the DLC film was evaluated. For evaluation of the wear resistance, a ball of ⅜ inches made of SUJ-2 (JIS G4805 high-carbon chrome bearing steel) was used, and the evaluation was made by the ball-on-disk method, in which the wear depth was measured after movement of 1 km under the conditions of a load of 50 gf and a speed of 0.1 m/second.

|  | Wear Resistance |
|---|---|
| Experimental Example X-1 | 3 μm |
| Experimental Example X-2 | 1 μm |
| Experimental Example X-3 | 1 μm |
| Experimental Example X-4 | 1 μm |
| Experimental Example X-5 | 1 μm |
| Unprocessed Object | 9 μm |

It can be understood from the above that the coating with the DLC film improves the wear resistance, and the pretreatment can further improve the wear resistance. The objects, which are coated with the DLC films after the pretreatment, have the wear resistances, which are larger by about nine times than that of the object not coated with the DLC film.

It was confirmed by the experiments that use of the benzene ($C_6H_6$) gas as the hydrocarbon compound gas provides advantages such as increase in carbon film deposition rate and others. These experiments will now be discussed.

The device in FIG. 1 was used, the pretreatment was effected, and carbon films (DLC films) were formed with two kinds of hydrocarbon compound gases, i.e., a methane ($CH_4$) gas (experimental example Y-1) and a benzene ($C_6H_6$) gas (experimental example Y-2). All the film formation target objects were made of silicone rubber, and each had sizes of 20 cm in diameter and 10 mm in thickness. The electrode of the device had sizes of 40 cm×40 cm (square).

EXPERIMENTAL EXAMPLE Y-1
Pretreatment Conditions
 Pretreatment gas: hydrogen ($H_2$), 100 sccm
 High-frequency power: frequency 13.56 MHz, 300 W
 Pretreatment pressure: 0.1 Torr
 Pretreatment time: 5 minutes Deposition Conditions
 A deposition material gas is supplied after discharging the pretreatment gas.
 Deposition material gas: methane ($CH_4$) gas, 100 sccm
 High-frequency power: frequency 13.56 MHz, 300 W
 Deposition pressure: 0.1 Torr
 Deposition rate: 100 Å/minute
 Deposition time: 60 minutes EXPERIMENTAL EXAMPLE Y-2
Pretreatment Conditions
 The pretreatment conditions are the same as those of the experimental example Y-1.
Deposition Conditions
 A deposition material gas is supplied after discharging the pretreatment gas.
 Deposition material gas: benzene ($C_6H_6$) gas, 20 sccm
 High-frequency power: frequency 13.56 MHz, 300 W
 Deposition pressure: 0.1 Torr
 Deposition rate: 600 Å/minute
 Deposition time: 20 minutes Then, evaluation of the friction coefficient, wear resistance, film adhesion and hardness was effected on each of the DLC film coated objects obtained in the foregoing experimental examples Y-1 and Y-2. The results are shown in the following table.

The friction coefficients were measured by a friction wear test machine of a pin-on-disk type. Measurement was performed for one hours with the load of 50 grams, the rotation radius of 5 mm and line speed of 10 cm/second, and the measured value at the end of test was handled as the friction coefficient.

The wear resistance was determined-and evaluated by a level difference meter from the wear depth, which was measured from the film surface to the bottom of the worn portion at the end of the test of determining the friction coefficient by the friction wear test machine of the pin-on-disk type.

The film adhesion was evaluated with a grid method of a tape peeling test (JIS K5400-1990).

The hardness was measured by a micro-hardness tester with a load of 5 mgf and a displacement of 0.1 μm.

|  | E*Y-1 | E*Y-2 |
|---|---|---|
| Depsotion rate (Å/min) | 100 | 600 |
| Friction coefficient (μ) | 0.8 | 0.6 |
| Wear depth (μm) | 1 | 0.8 |
| Hardness | 3 | 10 |
| Tape peeling test | 10 pts | 10 pts |

E*: experimental example
pts: points

As can be seen from the foregoing evaluation results, the benzene ($C_6H_6$) gas, which is the hydrocarbon compound gas used as the deposition material gas, improves not only the deposition rate but also the friction coefficient, wear resistance and hardness. The deposition rate can be probably improved owing to increase in number of carbon atoms in one mole of gas, as compared with the methane ($CH_4$) gas. The friction wear characteristics are probably improved owing to reduction in hydrogen concentration in the film, which improves of the film hardness.

(A) Formation of the fluorine/hydrogen-containing carbon film from the hydrocarbon compound gas and carbon fluoride compound gas Description will now be given on experimental examples (1-1–1-5) and comparative example 1 of manufacturing of carbon-film-coated objects containing fluorine and hydrogen by the device shown in FIG. 1. All the film formation target objects were made of silicone rubber, and each had sizes of 20 cm in diameter and 10 mm in thickness. The electrode of the device had sizes of 40 cm×40 cm (square).

EXPERIMENTAL EXAMPLES 1-1–1-5

Formation of Fluorine/Hydrogen-containing Carbon Films (Deposition After Pretreatment)
Pretreatment Conditions
  Pretreatment gas: hydrogen ($H_2$), 100 sccm
  High-frequency power: frequency 13.56 MHz, 300 W
  Pretreatment pressure: 0.1 Torr
  Pretreatment time: 5 minutes
Deposition: Deposition was made after discharging the pretreatment gas.
  Deposition material gas:
    methane ($CH_4$) gas,
    hexafluoroethane ($C_2F_6$) gas
  For changing the addition rate of fluorine, the supplied amount of hexafluoroethane gas was set to a constant value of 25 sccm, and the supplied amount of methane gas was changed as shown in FIG. 5 and the following table 1.

The mixing ratio (supply flow amount ratio) between these gases was determined as $(C_2F_6)/(CH_4+C_2F_6)$. The flow amount ratio was set to 0.2 in the experimental example 1-1, 0.33 in experimental example 1-2, 0.5 in experimental example 1-3, 0.71 in experimental example 1-4, and 0.83 in experimental example 1-5.

Figure 5:
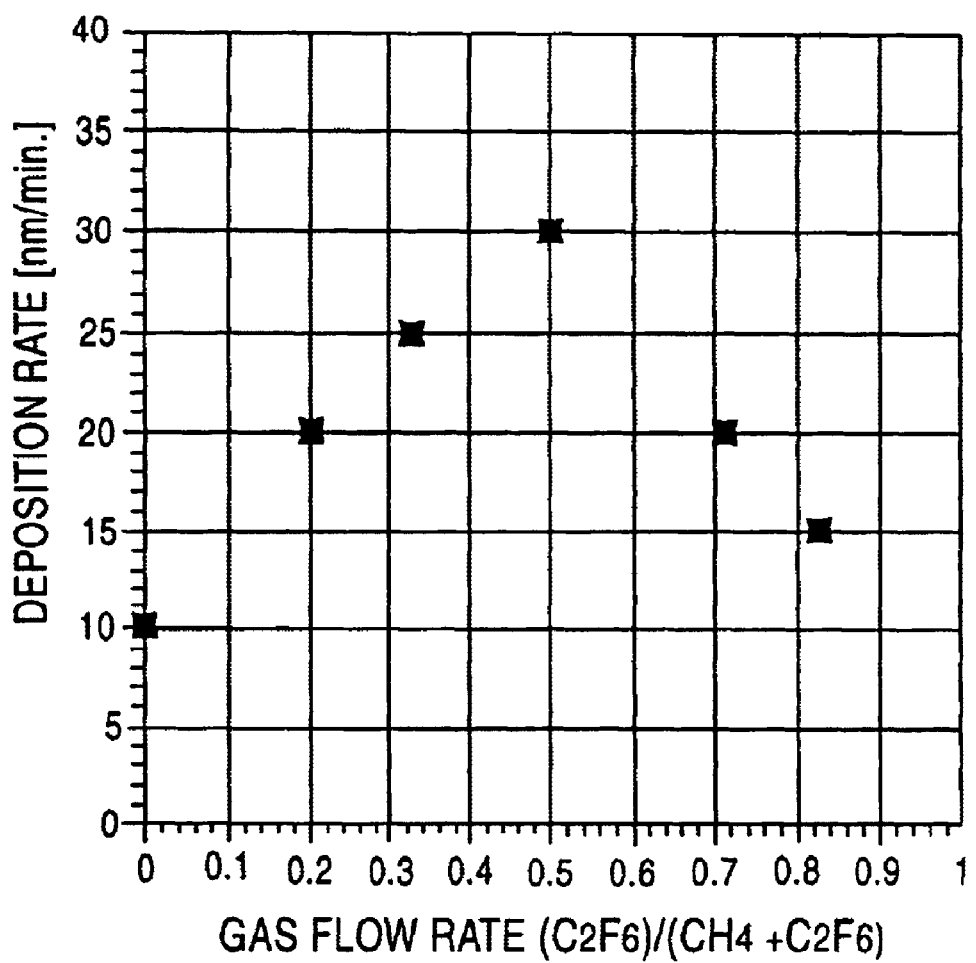
FIG. 5 shows a relationship between a supply flow rate of a hydrocarbon compound gas and a carbon fluoride compound gas forming a deposition gas and a deposition rate.

High-frequency power: frequency 13.56 MHz, 300 W
  Deposition pressure: 0.1 Torr
  Deposition temperature: room temperature
  Deposition time: 20 minutes FIG. 5 shows change in deposition rate with change in flow amount ratio. It can be seen from FIG. 5 that mixing of the carbon fluoride compound gas increases the deposition rate up to about three times. As the flow amount ratio changes toward 1, the deposition rate decreases, and the object is etched at the ratio of about 1. Therefore, it is preferable to perform the deposition at the flow amount ratio of 0.9 or less. Generally speaking, the flow amount ratio of (carbon fluoride compound gas)/(hydrocarbon compound gas+carbon fluoride compound gas) is desirably equal to 0.9 or less in view of the deposition rate.

COMPARATIVE EXAMPLE 1

Figure 6:
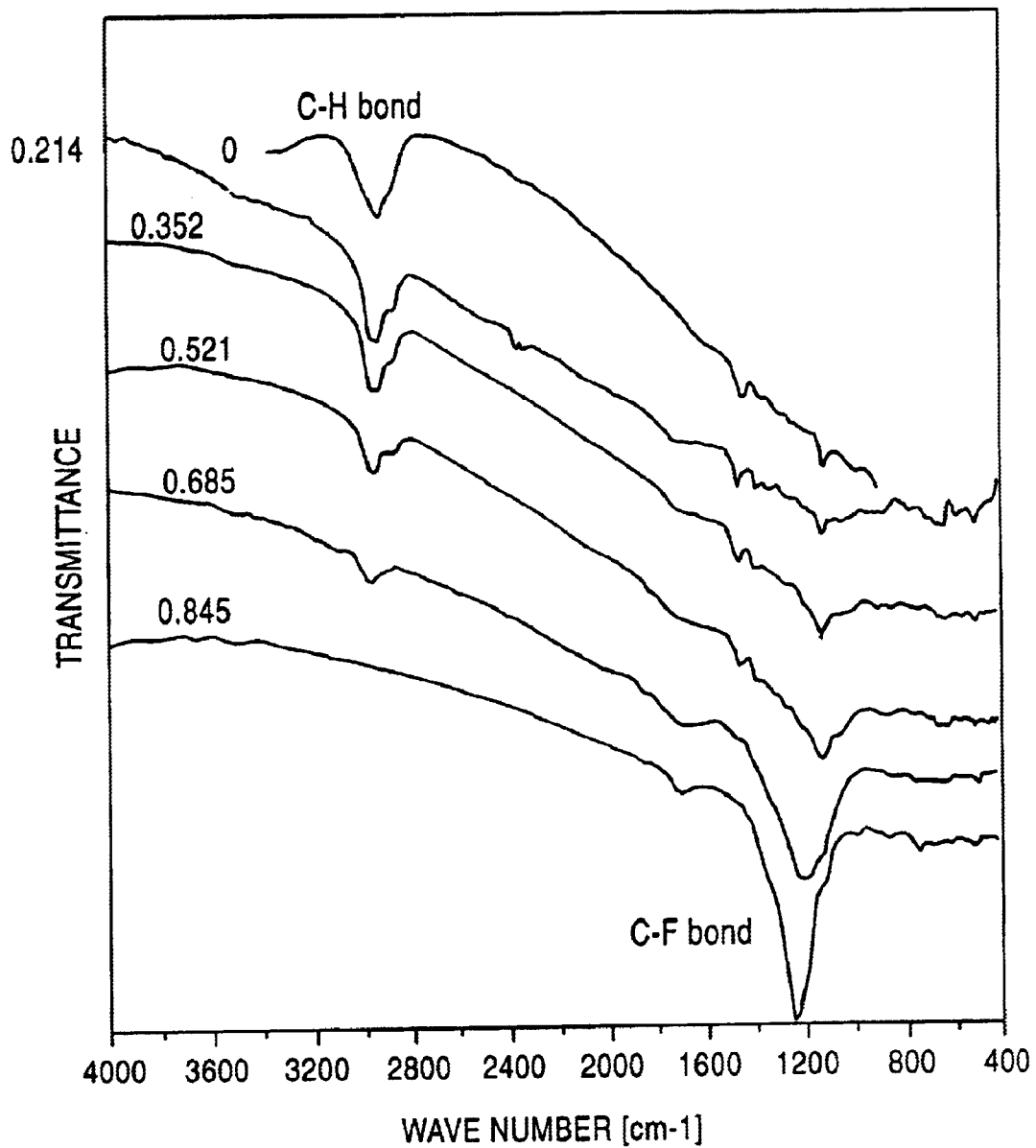
FIG. 6 shows a supply flow rate of a hydrocarbon compound gas and a carbon fluoride compound gas forming a deposition gas and spectra, determined by FT-IR spectrum analysis, of the carbon films formed with the supply flow rate.

Pretreatment: The same pretreatment as those in the experimental examples 1-1–1-5 was performed.
Deposition: Deposition was performed after discharging the pretreatment gas.
  Deposition material gas: methane ($CH_4$) gas, 100 sccm
  High-frequency power: frequency 13.56 MHz, 300 W
  Deposition pressure: 0.1 Torr
  Deposition temperature: room temperature
  Deposition time: 20 minutes The carbon films were formed under the conditions, which are the same as those of the foregoing experimental examples 1-1–1-5, except for that the flow amount ratio $((C_2F_6)/(CH_4+C_2F_6))$ was changed to 0.214, 0.352, 0.521, 0.685 and 0.845, respectively. FIG. 6 shows spectra determined by FT-IR (Fourier Transform Infrared) spectrum analysis in these carbon films as well as the carbon film (not containing fluorine) of the foregoing comparative example 1. From FIG. 6, it can be observed in the carbon films employing the hydrocarbon compound gas and carbon fluoride compound gas that a peak of C—H bonds is present substantially in a range from 2800 $cm^{-1}$ to 3100 $cm^{-1}$, and a peak of C—F bonds is present substantially in a range from 1000 $cm^{-1}$–1300 $cm^{-1}$. Accordingly, it can be confirmed that the carbon film, which contains the carbon, fluorine and hydrogen, and includes the C—F bond portion, was formed.

Figure 7:
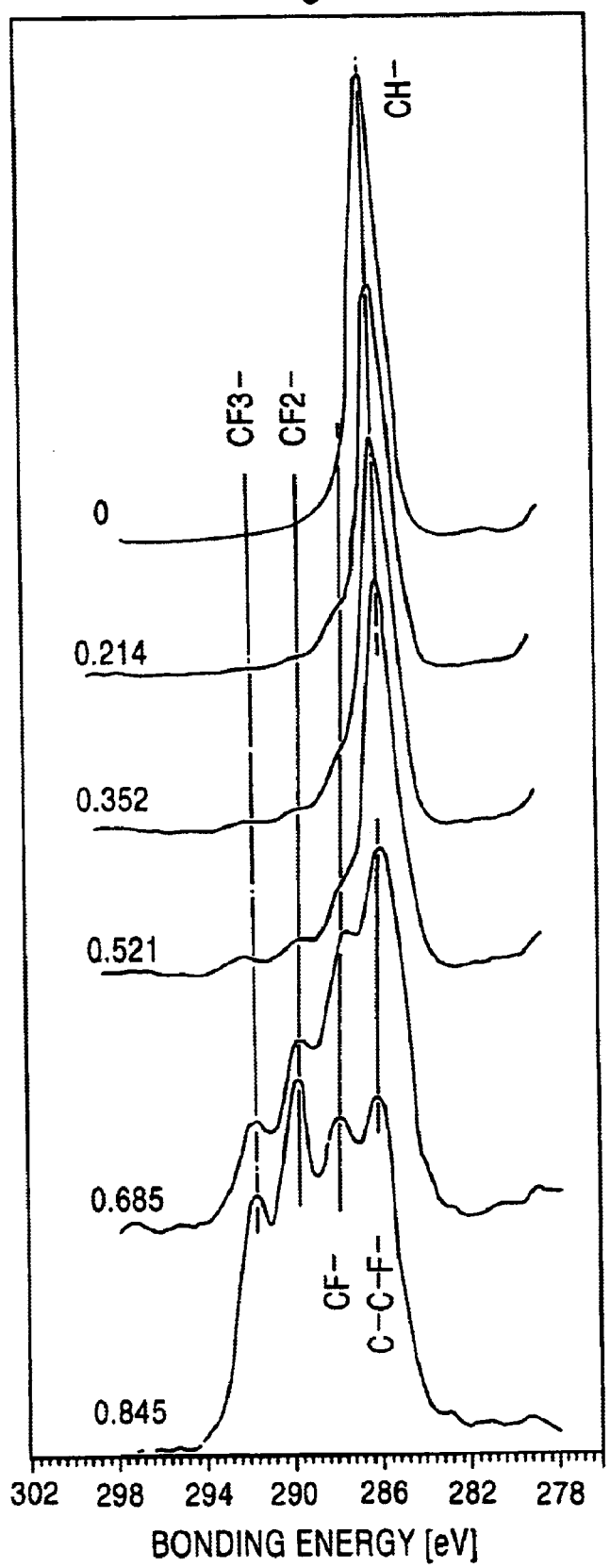
FIG. 7 shows a supply flow rate of a hydrocarbon compound gas and a carbon fluoride compound gas forming a deposition gas and spectra, determined by XPS, of the carbon films formed with the supply flow rate.

The carbon films were formed under the conditions, which are the same as those of the foregoing experimental examples 1-1–1-5, except for that the flow amount ratio $(C_2F_6)/(CH_4+C_2F_6)$ was changed to 0.214, 0.352, 0.521, 0.685 and 0.845, respectively. FIG. 7 shows spectra determined by XPS in these carbon films as well as the carbon film (not containing fluorine) of the foregoing comparative example 1. From FIG. 7, it can be observed that peaks of C—C—F—, CF—, $CF_2$—, $CF_3$— are present at or near 285.6 eV, 287.6 eV, 289.6 eV and 292.4 eV, respectively, and it can be likewise confirmed form these peaks that the carbon films having the C—F bond portions were formed.

Figure 8:
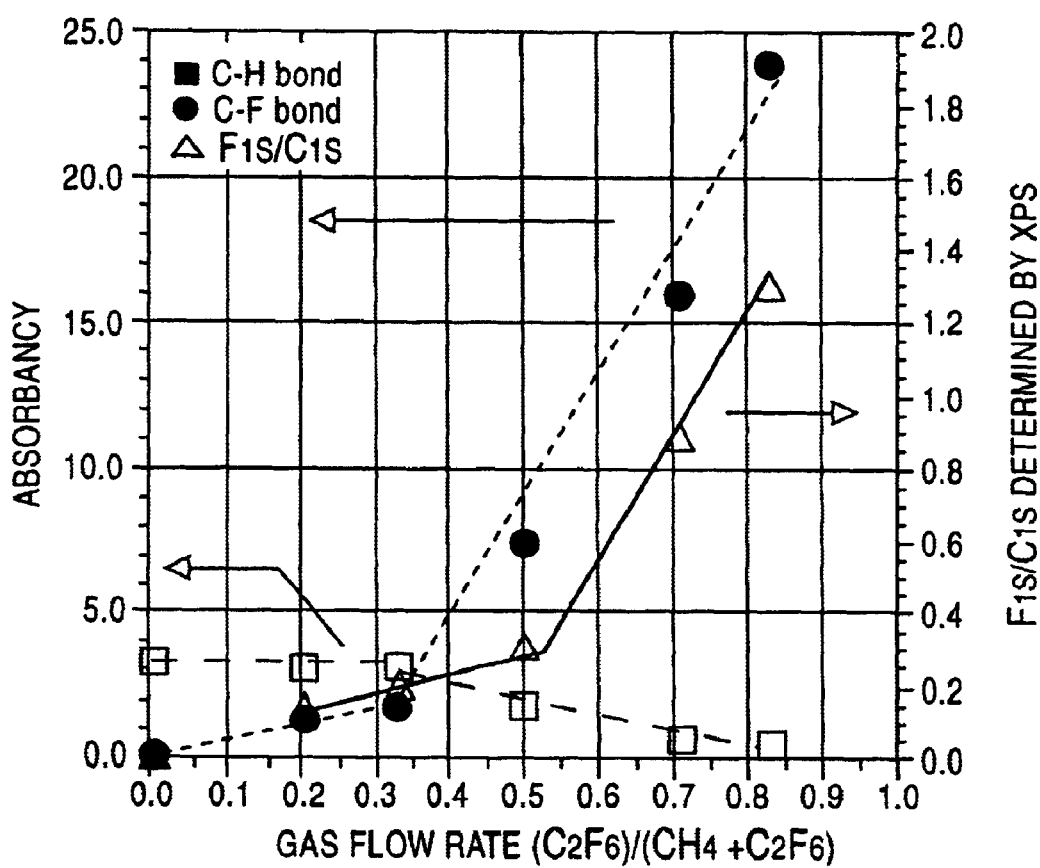
FIG. 8 shows a relationship between a ratio (IR.C—F)/(IR.C—H) of peak areas of spectrum determined by FT-IR spectrum analysis and ($F_{1S}/C_{1S}$) determined by XPS in the carbon film.

FIG. 8 shows a relationship relating to the spectrum, which was based on the spectrum determined by FT-IR spectrum analysis, in the carbon films of the experimental examples 1-1–1-5 and the comparative example 1, and particularly a relationship between a ratio (IR.C—F)/(IR.C—H) between a peak area (IR.C—F) in a range from 1000 $cm^{-1}$–1300 $cm^{-1}$ resulting from C—F bonds and a peak area (IR.C—H) in a range from 2800 $cm^{-1}$ to 3100 $cm^{-1}$ resulting from C—H bonds and a ratio $(F_{1S}/C_{1S})$, which was based on the spectrum determined by XPS (X-ray photoelectron spectrum analysis) between a peak intensity resulting from $F_{1S}$ and a peak intensity resulting from $C_{1S}$. From FIG. 8, it can be seen that (IR.C—F) and (IR.C—H) change in accordance with change in $(C_2F_6)/(CH_4+C_2F_6)$, and therefore the ratios of ((IR.C—F)/(IR.C—H)) and $(F_{1S}/C_{1S})$ change. If the flow amount ratio increases to 0.7 or more, the rate of C—H bonds was extremely small. In general, when the flow amount ratio of (carbon fluoride compound gas)/(hydrocarbon compound gas+carbon fluoride compound gas) increases to 0.7 or more, the rate of C—H bonds becomes small.

Figure 9:
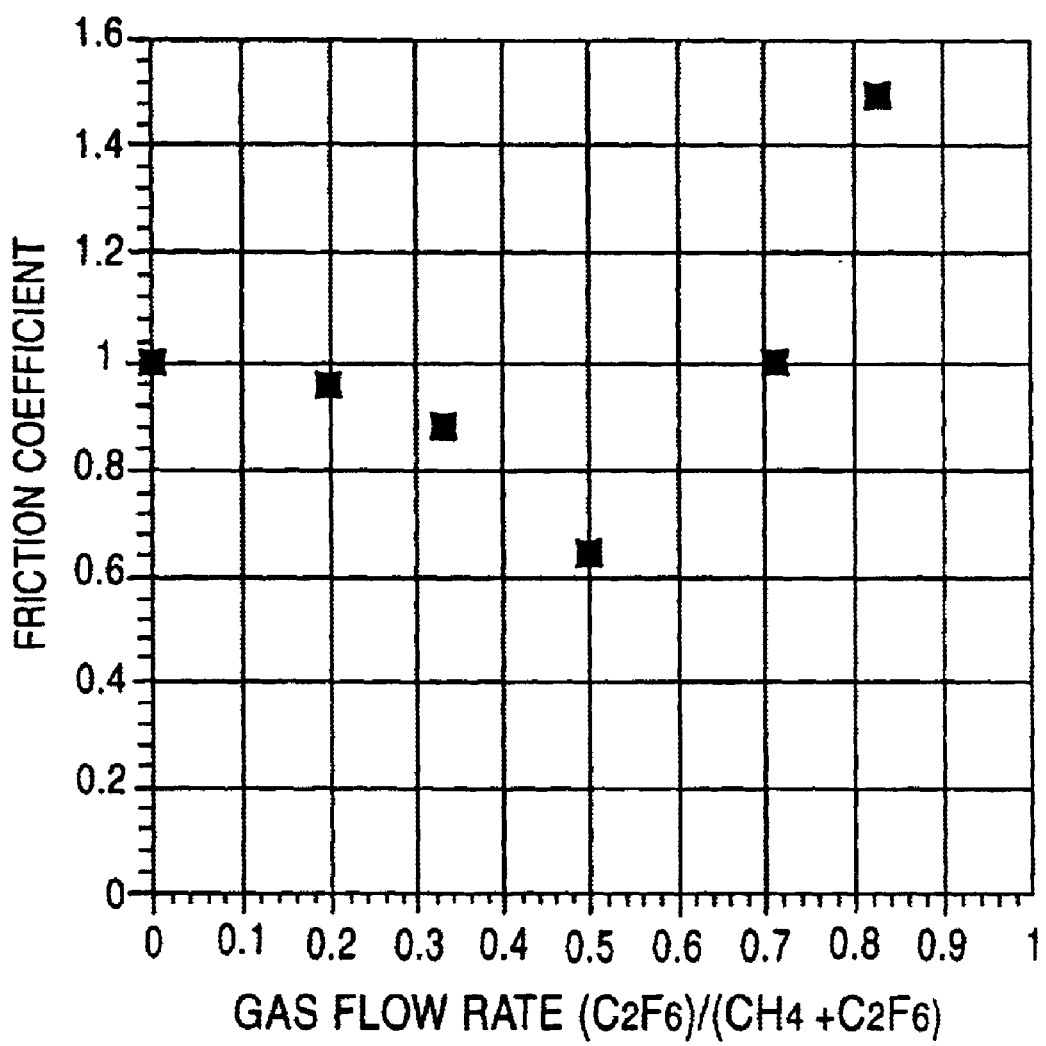
FIG. 9 shows a relationship between a supply flow rate of a hydrocarbon compound gas and a carbon fluoride compound gas forming a deposition gas and a friction coefficient of the carbon film.

Then, FIG. 9 shows a relationship between the friction coefficients of the carbon films of the experimental examples 1-1–1-5 and the comparative example 1. The friction coefficient was measured with a friction wear test machine of a reciprocating slide type with a load of 10 grams and 10 times of reciprocation. As can be seen from FIG. 9, the friction coefficient can be reduced to about 60% at the maximum by mixing fluorine into the carbon film. However, the flow amount ratio of 0.7 or more increases the friction coefficient. Therefore, it is desirable that the flow amount ratio does not exceed 0.7 and is equal to about 0.5 or less in view of improvement of lubricity. In general, it is desirable for improving the lubricity that the flow amount ratio of (carbon fluoride compound gas)/(hydrocarbon compound gas+ carbon fluoride compound gas) does not exceed 0.7, and is equal to about 0.5 or less.

Figure 10:
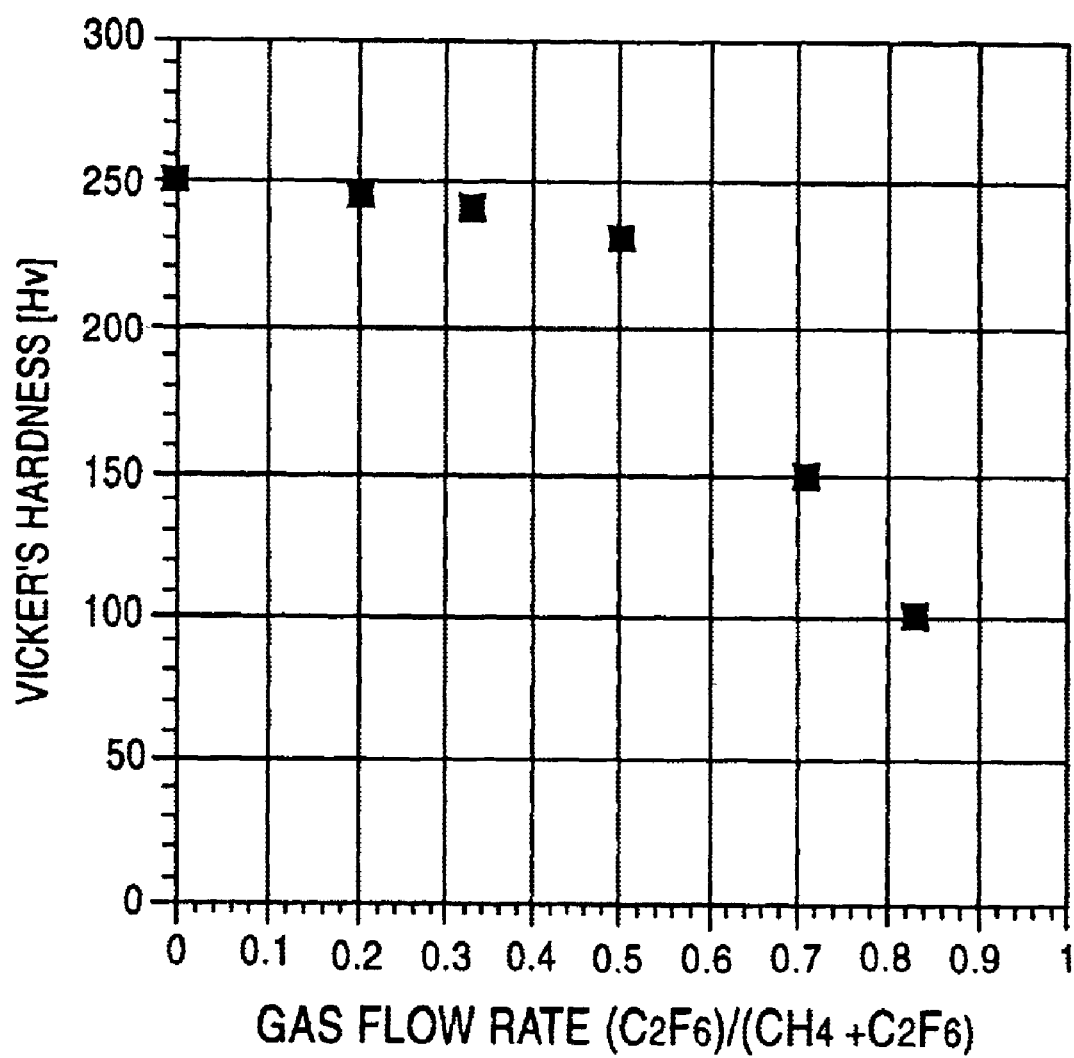
FIG. 10 shows a relationship between a supply flow rate of a hydrocarbon compound gas and a carbon fluoride compound gas forming a deposition gas and a hardness (Vickers' hardness) of the carbon film.

FIG. 10 shows a result of evaluation of the hardness (Vickers' hardness) of the carbon films of the experimental examples 1-1–1-5 and the comparative example 1. The hardness was measured by a micro-Vickers' hardness tester with a load of 10 mgf and a displacement of 0.25 μm. As shown in FIG. 10, the film hardness decreases in accordance with increase in flow amount ratio of $((C_2F_6)/(CH_4+C_2F_6))$, and significantly decreases when the flow amount ratio is 0.7 or more. Accordingly, the flow amount ratio of 0.5 or less is desired when the hardness similar to that of the carbon film is required. In general, the flow amount ratio of (carbon fluoride compound gas)/(hydrocarbon compound gas+ carbon fluoride compound gas) of 0.5 or less is desired when the hardness similar to that of the carbon film is required.

The evaluation of the film adhesion to the object was made on the carbon films of the experimental examples 1-1–1-5 as well as the comparative example 1. The film adhesion was evaluated with the grid method of the tape peeling test (JIS K5400-1990). The result is shown in the following table 1. With the flow amount ratio of up to 0.5, the carbon film exhibits high adhesion, but the film nearly made of only the fluoride exhibits low adhesion. In general, the flow amount ratio of (carbon fluoride compound gas)/ (hydrocarbon compound gas+carbon fluoride compound gas) of 0.5 or less provides the carbon film having high adhesion.

Figure 11:
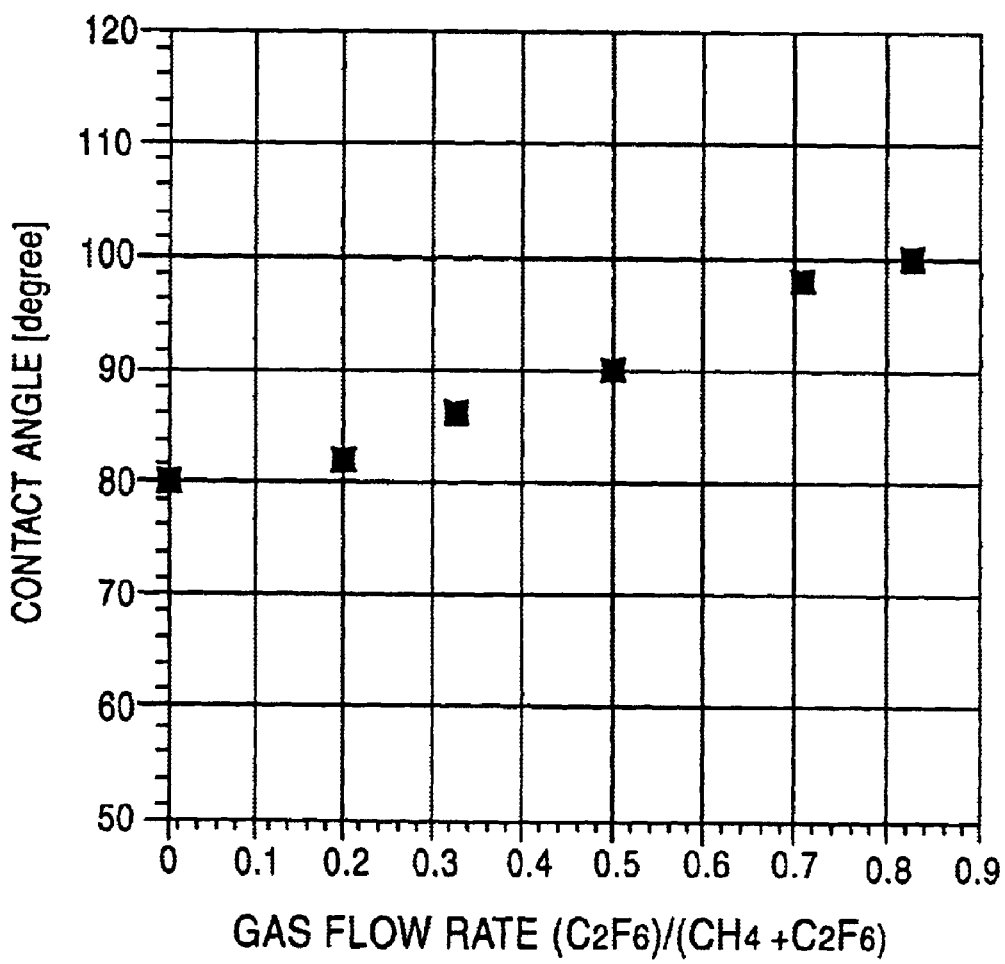
FIG. 11 shows a relationship between a supply flow rate of a hydrocarbon compound gas and a carbon fluoride compound gas forming a deposition gas and water repellency (repellency angle and contact angle) of the carbon film.

The evaluation of the water repellency to the object was made on the carbon films of the experimental examples 1-1–1-5 as well as the comparative example 1. The water repellency was evaluated by measuring a contact angle of a droplet of pure water placed on each carbon film. The contact angle represents one of angles defined between a surface of a solid and a tangential line extending along the surface of the liquid droplet and through a contact point among three phases, i.e., solid, liquid and gas in such a situation that a fluid droplet is located on the solid surface in the air, and more specifically represents the angle containing the liquid droplet. The larger value represents better water repellency. FIG. 11 shows a relationship between the flow amount ratio of $((C_2F_6)/(CH_4+C_2F_6))$ and the contact angle (repellency) of each carbon film. In general, the flow amount ratio of (carbon fluoride compound gas)/(hydrocarbon compound gas+carbon fluoride compound gas) of 0.7 or more is desirable for improving the repellency.

From these results, the friction coefficient and the repellency can be improved by controlling the flow amount ratio.

The results of evaluation described above are summarized in the table 1.

TABLE 1

|  | C*1 | E*1-1 | E*1-2 | E*1-3 | E*1-4 | E*1-5 |
|---|---|---|---|---|---|---|
| $CH_4$ (sccm) | 100 | 100 | 50 | 25 | 10 | 5 |
| $C_2F_6$ (sccm) | 0 | 25 | 25 | 25 | 25 | 25 |
| ratio* | 0 | 0.2 | 0.33 | 0.5 | 0.71 | 0.83 |
| rate* | 10 | 20 | 25 | 30 | 20 | 15 |
| f/c* | 1 | 0.95 | 0.88 | 0.64 | 1 | 1 |
| hardness* | 250 | 240 | 230 | 180 | 100 | 80 |
| test* | 10 | 10 | 10 | 10 | 8 | 8 |
| angle* | 80 | 82 | 86 | 90 | 98 | 100 |

C*: comparative example
E*: experimental example
ratio*: flow amount ratio $((C_2F_6)/(CH_4 + C_2F_6))$
rate*: deposition rate (nm/minute)
f/c*: friction coefficient
hardness*: Vickers' hardness
test*: tape peeling test (pts)
angle*: repellency angle (contact angle) (degrees)

(B) Formation of the fluorine/hydrogen-containing carbon film from the hydrocarbon compound gas and carbon fluoride compound gas, and particularly the carbon film of an oblique structure, in which a fluorine content changes in the direction of the film thickness.

Description will now be given on experimental examples (2-1–2-4) of forming the carbon films of the oblique structure, in which the C—F bond portions increase in the direction of the thickness of the carbon film as the position moves away from the object surface. Similarly to the cases of the experimental examples 1-1–1-5 already described, all the film formation target objects were made of silicone rubber, and each had sizes of 20 cm in diameter and 10 mm in thickness. The electrode of the device had sizes of 40 cm×40 cm (square). In each experiment, a pretreatment was effected on the object surface with a hydrogen gas plasma prior to the formation of the carbon film, similarly to the foregoing experimental examples 1-1 and others.

EXPERIMENTAL EXAMPLES 2-1–2-4

Formation of Fluorine/Hydrogen-containing Carbon Films (Deposition After Pretreatment)

Pretreatment Conditions

Pretreatment gas: hydrogen ($H_2$), 100 sccm
  High-frequency power: frequency 13.56 MHz, 300 W
  Pretreatment pressure: 0.1 Torr
  Pretreatment time: 5 minutes
  Deposition: Deposition was made after discharging the pretreatment gas.
  Deposition material gas: methane ($CH_4$) gas
    hexafluoroethane ($C_2F_6$) gas For changing the addition rate of fluorine stepwise, the supplied amount of hexafluoroethane gas was set to a constant value of 25 sccm, and the supplied amount of methane gas was changed as shown in the following table 2.

High-frequency power: frequency 13.56 MHz, 300 W
  Deposition pressure: 0.1 Torr
  Deposition temperature: room temperature
  Deposition time: 20 minutes

TABLE 2

|  | 1st layer | | 2nd layer | | 3rd layer | | 4th layer | |
|---|---|---|---|---|---|---|---|---|
|  | f/t* | f/r* | f/t* | f/r* | f/t* | f/r | f/t* | f/r |
| E*1-5 | 400 | 0.83 | 0 | | 0 | | 0 | |
| E*2-1 | 200 | 0.71 | 200 | 0.83 | 0 | | 0 | |
| E*2-2 | 200 | 0.5 | 200 | 0.83 | 0 | | 0 | |
| E*2-3 | 100 | 0.2 | 100 | 0.33 | 100 | 0.5 | 100 | 0.83 |
| E*2-4 | 100 | 0 | 100 | 0.2 | 100 | 0.5 | 100 | 0.83 | f/t*: film thickness
f/r*: flow amount ratio

In the above table 2, the unit of the film thickness is nanometer (nm), and the flow amount ratio is equal to $(C_2F_6)/(CH_4+C_2F_6)$ which is the ratio between the flow amounts of the respective gases supplied to the vacuum chamber 1. The set thickness of the film was calculated from the deposition speed or rate. Each carbon film has a thickness of 400 nm as a whole. The experimental example 1-5 in the table 2 is the same as that already described, and is exhibited for comparison.

The evaluation of the hardness and adhesion was made on these carbon films. The manner of evaluating the hardness and the adhesion is the same as that for the experimental examples 1-1–1-5. The result of evaluation was shown in the following table 3.

TABLE 3

|  | E*1-5 | E*2-1 | E*2-2 | E*2-3 | E*2-4 |
|---|---|---|---|---|---|
| hardness* | 80 | 90 | 150 | 200 | 220 |
| test* | 8 | 8 | 8 | 10 | 10 | hardness*: Vickers' hardness
test*: tape peeling test (pts)

As can be seen from the above result, the inclination of the amount of fluorine in the carbon film can improve both the film adhesion and the hardness (and therefore, wear resistance). It is desirable that the carbon layer nearest to the surface of the object is a DLC layer.

(C) Formation of the fluorine/hydrogen-containing carbon film from the hydrocarbon compound gas and the carbon fluoride compound gas, and particularly, film formation employing a high-frequency power subjected to frequency modulation as a power for gas plasma formation.

Then, such experiments were performed that the device shown in FIG. 2 was used, the conditions of the foregoing experimental examples 1-1 (flow amount ratio: 0.2), 1-3 (flow amount ratio: 0.5) and 1-5 (flow amount ratio: 0.83) were employed, except for that the power prepared by effecting the frequency modulation on the basic high-frequency power of 13.56 MHz was used as the power for gas plasma formation, and the duty ratio was 50%.

Figure 12:
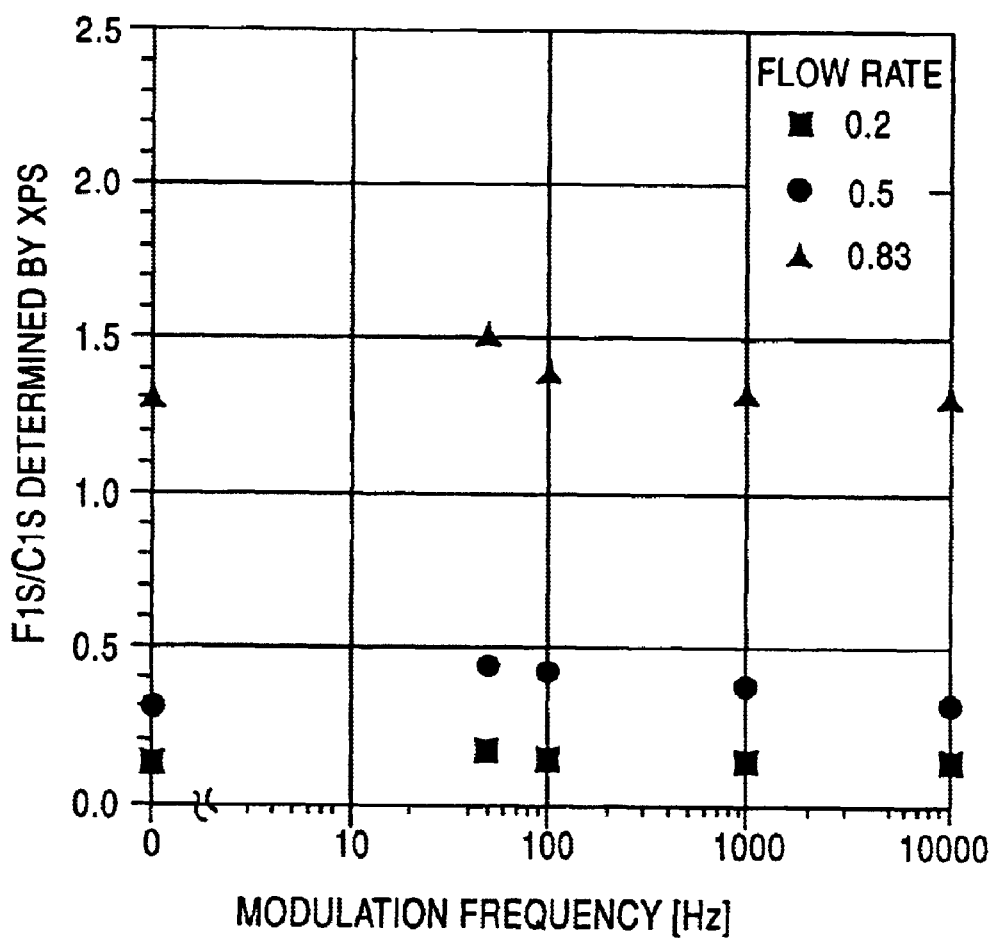
FIG. 12 shows a relationship between a modulation frequency of a high-frequency power for gas plasma formation and ($F_{1S}/C_{1S}$), determined by XPS, of the carbon film formed under the modulation frequency.

FIG. 12 shows a relationship between the above modulation frequency (Hz) and the ratio ($F_{1S}/C_{1S}$) between a peak intensity resulting from $F_{1S}$ and a peak intensity resulting from $C_{1S}$ in the spectrum, determined by XPS, of the film formed with the modulation frequency.

FIG. 12 shows that $F_{1S}/C_{1S}$ takes the maximum value when the modulation frequency is 50 Hz, regardless of the flow amount ratio.

Figure 13:
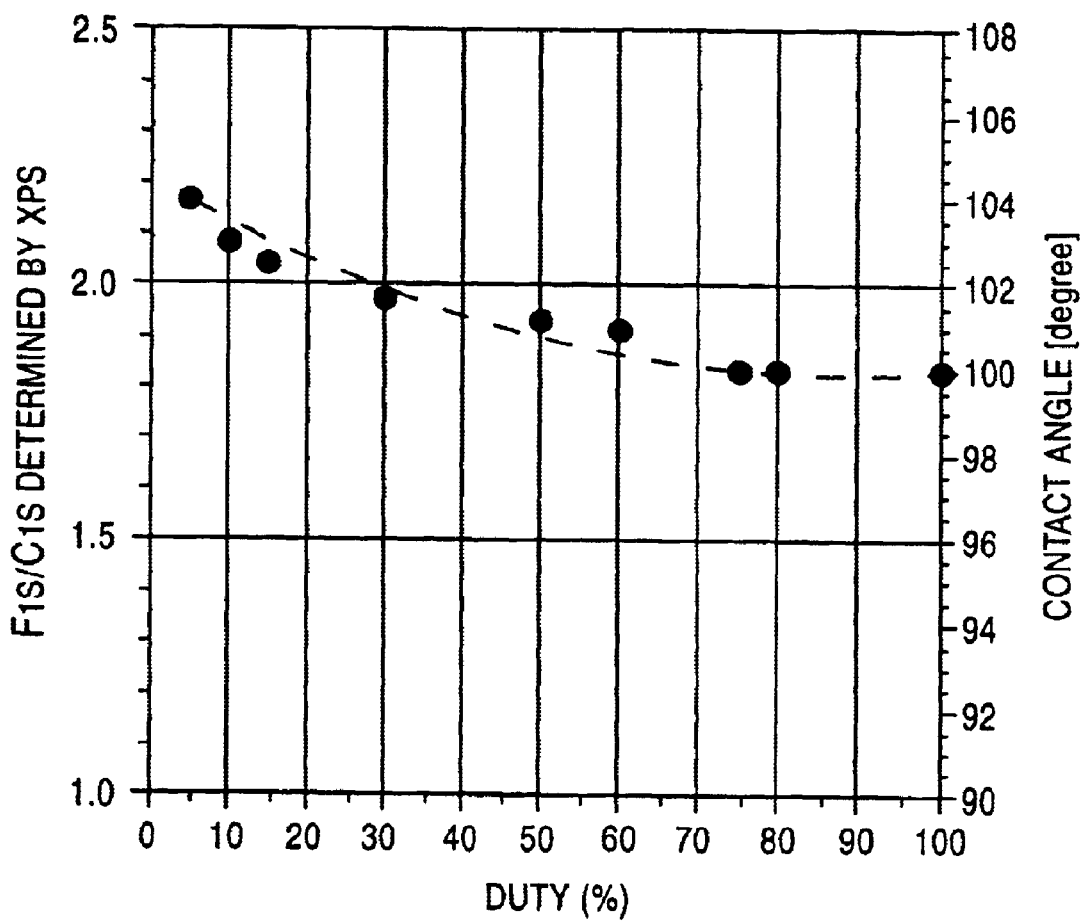
FIG. 13 shows a relationship between a duty of frequency modulation of the high-frequency power for gas plasma formation and ($F_{1S}/C_{1S}$), determined by XPS, and water repellency of the carbon film formed under the modulation frequency.

Then, the determination was made on the relationship of the duty ratio, $F_{1S}/C_{1S}$ and the water repellency of the carbon film. For the determination, the carbon films were prepared under such conditions that the device shown in FIG. 2 was used in the film formation of the foregoing experimental examples 1-5 (flow amount ratio: 0.83), the power prepared by effecting the frequency modulation of 50 Hz on the basic high-frequency power of 13.56 MHz was used as the power for gas plasma formation, and the duty ratio was variable. As can be seen from FIG. 13, when the duty ratio is 5%, the $F_{1S}/C_{1S}$ takes the maximum value, and the repellency angle (contact angle) exhibiting the repellency takes the maximum value (104°) (100° in the carbon film of the experimental example 1-5). Accordingly, it can be considered that application of the high-frequency power subjected to the frequency modulation improves the water repellency.

(D) Formation of the fluorine/hydrogen-containing carbon film from the hydrocarbon compound gas and the carbon fluoride compound gas, and particularly, film formation employing the nitrogen gas as a further deposition material gas.

Then, experiments (experimental examples 3-2 and 3-3) of forming the carbon films were performed under such conditions that the device shown in FIG. 1 was used in the film formation of the foregoing experimental examples 1-1 and 1-5, and the nitrogen gas of 50 sccm was employed as the further deposition material gas in addition to the methane ($CH_4$) gas and hexafluoroethane ($C_2F_6$) gas. The evaluation of the film hardness was made on the carbon films. The result is shown in the following table 4. For reference, the table 4 additionally shows the result of the carbon film of the foregoing experimental example 1 and the carbon film (experimental example 3-1), in which the nitrogen gas of 50 sccm was employed in addition to the methane ($CH_4$) gas in the comparative example 1.

TABLE 4

| | C*1 | E*1-1 | E*1-5 | E*3-1 | E*3-2 | E*3-3 |
|---|---|---|---|---|---|---|
| Vickers' hardness | 250 | 240 | 80 | 300 | 280 | 200 |

As can be seen from the table 4, addition of the nitrogen gas can increase the film hardness 1.2–2.5 times. It can be considered that nitride was formed in the film.

(E) Formation of the fluorine/hydrogen-containing carbon film from the hydrocarbon compound gas and the carbon fluoride compound gas, and particularly, film formation employing a gas forming metal, metal compound, silicon or silicon compound as a further deposition material gas.

Then, experimental examples 4-2 and 4-3 of forming the carbon films were performed under such conditions that the device shown in FIG. 3 was used, TEOS (tetraethyl-O-silicate, $Si(C_2H_5O)_4$) and an oxygen gas were employed in addition to the methane ($CH_4$) gas and hexafluoroethane ($C_2F_6$) gas, the methane ($CH_4$) gas and hexafluoroethane ($C_2F_6$) gas were supplied into the plasma processing chamber 20 of the device shown in FIG. 3, and the TEOS and the oxygen gas were supplied into the plasma producing chamber 10 to form the carbon film additionally containing the silicon oxide. Description will also be given on a reference experimental example 4-1, in which the TEOS and the oxygen gas were employed as the deposition material gas in addition to the methane ($CH_4$) gas, the methane ($CH_4$) gas was supplied to the plasma processing chamber 20, the TEOS and the oxygen gas were supplied to the plasma producing chamber 10 for forming the carbon film.

All the film formation target objects were made of silicone rubber, and each had sizes of 20 cm in diameter and 10 mm in thickness. The electrode of the device had sizes of 40 cm×40 cm (square).

REFERENCE EXPERIMENTAL EXAMPLE 4-1

Pretreatment: A hydrogen gas for pretreatment was supplied into the deposition chamber R, and the pretreatment was performed under the conditions similar to those in the experimental examples 1-1–1-5.

Deposition: Deposition was made after discharging the pretreatment gas.

Deposition material gas: methane ($CH_4$) gas of 100 sccm was supplied to the plasma processing chamber 20.

TEOS of 10 sccm and oxygen gas of 90 sccm were supplied to the plasma producing chamber 10.

High-frequency power:
frequency 13.56 MHz, 300 W for plasma processing chamber 20
frequency 13.56 MHz, 500 W for plasma producing chamber 10

Deposition pressure: 0.01 Torr

Deposition temperature: room temperature

Deposition time: 20 minutes

EXPERIMENTAL EXAMPLE 4-2

Pretreatment: Pretreatment was performed similarly to the reference experimental example 4-1, Deposition: Deposition was made after discharging the pretreatment gas.

Deposition material gas: methane ($CH_4$) gas and hexafluoroethane ($C_2F_6$) gas (25 sccm) were supplied to the plasma processing chamber. The flow amount ratio (($C_2F_6$)/($CH_4+C_2F_6$)) was equal to 0.2.

TEOS of 10 sccm and oxygen gas of 90 sccm were supplied to the plasma producing chamber.

High-frequency power:
frequency 13.56 MHz, 300 W for plasma processing chamber 20
frequency 13.56 MHz, 500 W for plasma producing chamber 10

Deposition pressure: 0.01 Torr

Deposition temperature: room temperature

Deposition time: 20 minutes

EXPERIMENTAL EXAMPLE 4-3

Pretreatment: The pretreatment was performed similarly to the experimental example 4-2.

Deposition: Deposition was performed under the same conditions as the experimental example 4-2 except for that the flow amount ratio $((C_2F_6)/(CH_4+C_2F_6))$ was equal to 0.83.

The evaluation of the hardness was made on these carbon films. The manner of evaluating the hardness was the same as that in the foregoing experimental examples 1-1~1-5. The result of evaluation was shown in the following table 5.

In the table 5, the comparative example 1 as well as the experimental examples 1-1 and 1-5 are shown for comparison.

TABLE 5

|  | C*1 | E*1-1 | E*1-5 | E*4-1 | E*4-2 | E*4-3 |
|---|---|---|---|---|---|---|
| Vickers' hardness | 250 | 240 | 80 | 500 | 500 | 300 |

From the results, it can be understood that addition of the silicon oxide to the carbon film increases the film hardness about 2 to 4 times so that the hardness can be almost two times larger than that obtained by mixing of the nitrogen as described above.

It can also be understood that the gases in the plasma producing chamber 10 and the plasma processing chamber 20 can be effectively decomposed with appropriate electric powers by independently selecting the powers for gas plasma formation in these chambers, respectively.

As already described, the film hardness can also be improved by addition of at least one of the metal, metal compound, silicon and silicon compound. The following table 6 exemplifies materials which can be employed for addition of these materials, materials to be used for combination (materials 1 and 2), and materials produced thereby in the carbon films. In the table 6, the silicon is classified as metal, and the silicon compound is classified as metal compound.

TABLE 6

|  |  | Material 1 | M2* | P/M* |
|---|---|---|---|---|
| Metal | Ti: | $TiCl_4$, $Ti((C_2H_5)_4)$, $Ti(O\text{-}i\text{-}C_3H_7)_4$ |  | Ti |
|  | Si: | $SiCl_4$, $SiH_4$, TEOS |  | Si |
|  | Cr: | $Cr(C_6H_6)_2$, $Cr(CH_3C_5H_4)_2$, $Cr(C_5H_5)_2$ |  | Cr |
| Metal | Ti: | $TiCl_4$, $Ti((C_2H_5)_4)$, $Ti(O\text{-}i\text{-}C_3H_7)_4$ | $O_2$ | TiOx |
| Oxide | Si: | $SiCl_4$, $SiH_4$, TEOS | O | SiOx |
|  | Cr: | $Cr(C_6H_6)_2$, $Cr(CH_3C_5H_4)_2$, $Cr(C_5H_5)_2$ | $H_2O$ | CrOx |
| Metal | Ti: | $TiCl_4$, $Ti((C_2H_5)_4)$, $Ti(O\text{-}i\text{-}C_3H_7)_4$ | $N_2$ | TiNx |
| Nitride | Si: | $SiCl_4$, $SiH_4$, TEOS | $NH_3$ | SiNx |
|  | Cr: | $Cr(C_6H_6)_2$, $Cr(CH_3C_5H_4)_2$, $Cr(C_5H_5)_2$ |  | CrNx |
| Metal | Ti: | $TiCl_4$, $Ti((C_2H_5)_4)$, $Ti(O\text{-}i\text{-}C_3H_7)_4$ | $CH_4$ | TiCx |
| Carbide | Si: | $SiCl_4$, $SiH_4$, TEOS | $C_2H_6$ | SiCx |
|  | Cr: | $Cr(C_6H_6)_2$, $Cr(CH_3C_5H_4)_2$, $Cr(C_5H_5)_2$ |  | CrCx |

M2*: material 2
P/M*: produced material in the film (F) Formation of the hydrogen/nitrogen-containing carbon film from the hydrocarbon compound gas and the nitrogen containing gas.

Description will now be given on experimental examples (5-1–5-3) of manufacturing objects, which are coated with the carbon films containing hydrogen and nitrogen, by the device shown in FIG. 1, and also comparative experimental example 5-C. All the film formation target objects were made of silicone rubber, and each had sizes of 20 cm in diameter and 10 mm in thickness. The electrode of the device had sizes of 40 cm×40 cm (square).

EXPERIMENTAL EXAMPLES 5-1–5-3

Formation of Hydrogen/Nitrogen-containing Carbon Films (Deposition After Pretreatment)

Pretreatment Conditions
  Pretreatment gas: hydrogen $(H_2)$, 100 sccm
  High-frequency power: frequency 13.56 MHz, 300 W
  Pretreatment pressure: 0.1 Torr
  Pretreatment time: 5 minutes Deposition: Deposition was made after discharging the pretreatment gas.
  Deposition material gas: benzene $(C_6H_6)$ gas
    nitrogen gas
  High-frequency power: frequency 13.56 MHz, 300 W
  Deposition pressure: 0.1 Torr The experimental examples 5-1–5-3 were different in supplied amounts of the benzene gas and nitrogen gas as well as mixing rate of them (supply flow amount ratio)= $(N_2)/(N_2+C_6H_6)$.

COMPARATIVE EXAMPLE 5-C

Pretreatment: The pretreatment is the same as those in the experimental examples 5-1–5-3.

Deposition: Deposition was made after discharging the pretreatment gas.
  Deposition material gas: benzene $(C_6H_6)$ gas, 20 sccm
  High-frequency power: frequency 13.56 MHz, 300 W
  Deposition pressure: 0.1 Torr The following table 7 shows results of evaluation made on the experimental examples 5-1–5-3 and the comparative example 5-C in connection with the flow amount ratio $((N_2)/(N_2+C_6H_6))$, deposition rate, friction coefficient, wear depth and film hardness as well as the tape peeling test. The evaluation of the friction coefficient, wear depth and film hardness as well as the tape peeling test result were performed in the same manner as the experimental examples Y-1 and Y-2 already described.

TABLE 7

|  | C*5-C | E*5-1 | E*5-2 | E*5-3 |
|---|---|---|---|---|
| $C_6H_6$ amount (sccm) | 20 | 18 | 10 | 4 |
| $N_2$ amount (sccm) | 0 | 2 | 10 | 16 |
| $(N_2)/(N_2 + C_6H_6)$ | 0 | 0.1 | 0.5 | 0.8 |
| deposition rate (nm/min) | 60 | 60 | 50 | 10 |
| friction coefficient ($\mu$) | 0.6 | 0.4 | 0.6 | 0.8 |
| wear depth ($\mu m$) | 0.8 | 0.6 | 0.8 | 1.5 |
| hardness | 10 | 12 | 10 | 3 |
| tape peeling test (pts) | 10 | 10 | 10 | 2 |

In the experimental examples 5-1–5-3, as can be seen from FIG. 7, the deposition rate slowly decreases as the flow amount ratio of $(N_2)/(N_2+C_6H_6)$ increases. When the flow amount ratio exceeds 0.5, the deposition rate changes to about ⅕ of that of the comparative example, in which only the benzene gas is used for the film formation. It can be seen from the above that the flow amount ratio is desirably 0.5 or less in view of the productivity.

By mixing the nitrogen into the carbon film, as is done in the experimental example 5-1, the friction coefficient can be reduced by 60% at the maximum. However, if the flow amount ratio of the nitrogen exceeds 0.5, the friction coefficient increases. Therefore, the flow amount ratio is desirably 0.5 or less from the viewpoint of the friction coefficient.

By adding the nitrogen, as is done in the experimental example 5-1, the wear depth decreases. However, if the flow amount ratio of the nitrogen exceeds 0.5, the wear depth increases. Accordingly, the flow amount ratio is desirably 0.5 or less from the viewpoint of the wear depth.

By adding the nitrogen, as is done in the experimental example 5-1, the film hardness increases. However, if the flow amount ratio of the nitrogen exceeds 0.5, the film hardness becomes lower than that in the case of not adding the nitrogen. Accordingly, the flow amount ratio is desirably 0.5 or less from the viewpoint of the film hardness.

As can be seen from the results of the tape peeling test, the flow amount ratio is desirably 0.5 or less in view of the film adhesion.

(G) Formation of the carbon film containing hydrogen and metal oxide (silicon oxide in this example) from the hydrocarbon compound gas and the TEOS gas.

Description will now be given on experimental examples (6-1–6-3) of manufacturing objects, which are coated with the carbon films containing hydrogen and metal oxide, by the device shown in FIG. 1. All the film formation target objects were made of silicone rubber, and each had sizes of 20 cm in diameter and 10 mm in thickness. The electrode of the device had sizes of 40 cm×40 cm (square).

EXPERIMENTAL EXAMPLES 6-1–6-3

Formation of Carbon Films Containing Hydrogen and Metal Oxide (Deposition After Pretreatment)

Pretreatment Conditions

Pretreatment gas: hydrogen ($H_2$), 100 sccm

High-frequency power: frequency 13.56 MHz, 300 W

Pretreatment pressure: 0.1 Torr

Pretreatment time: 5 minutes

Deposition: Deposition was made after discharging the pretreatment gas.

Deposition material gas:
  benzene ($C_6H_6$) gas
  TEOS gas

High-frequency power: frequency 13.56 MHz, 300 W

Deposition pressure: 0.1 Torr

In the experimental examples 6-1–6-3, the supplied amount of the benzene gas was constant and equal to 20 sccm, the supplied amount of the TEOS gas was changed in a range of 10–30 sccm, and thereby the mixing rate of them (supply flow amount ratio)=(TEOS)/(TEOS+$C_6H_6$) was changed.

The following table 8 shows results of evaluation made on the experimental examples 6-1–6-3 and the comparative example 5-C in connection with the deposition rate, friction coefficient, wear depth and film hardness as well as the tape peeling test result. The evaluation of the friction coefficient, wear depth and film hardness as well as the tape peeling test result were performed in the same manner as the experimental examples Y-1 and Y-2 already described.

TABLE 8

|  | C*5-C | E*6-1 | E*6-2 | E*6-3 |
| --- | --- | --- | --- | --- |
| $C_6H_6$ amount (sccm) | 20 | 20 | 20 | 20 |
| TEOS amount (sccm) | 0 | 10 | 20 | 30 |
| deposition rate (nm/min) | 60 | 50 | 50 | 40 |
| friction coefficient ($\mu$) | 0.6 | 0.3 | 0.2 | 0.2 |
| wear depth ($\mu$m) | 0.8 | 0.6 | 0.4 | 0.4 |
| hardness | 10 | 10 | 10 | 8 |
| tape peeling test (pts) | 10 | 10 | 10 | 2 |

As can be seen from the table 8, the deposition rate lowers in accordance with increase in supplied amount of TEOS. The friction coefficient lowers in accordance with increase in supplied amount of TEOS. The wear depth likewise lowers in accordance with increase in supplied amount of TEOS. The film hardness lowers by 20% when the TEOS supplied amount is equal to 30 sccm. The film adhesion lowers when the TEOS supplied amount is equal to 30 sccm. In view of the above, the TEOS supplied amount is desirably 20 sccm or less.

It can be seen from the above that addition of the TEOS gas to the benzene ($C_6H_6$) gas hardly changes the film hardness, but remarkably improves the friction wear characteristics. This is probably owing to the fact that the silicon oxide ($SiO_2$) is containing in the carbon film. However, if an excessively large amount of TEOS is added, the carbon film portion which is compatible with the polymer base member decreases, and thereby the film adhesion lowers.

(H) Formation of the carbon film containing hydrogen and metal oxide (silicon oxide in this example) from the hydrocarbon compound gas and the TEOS gas.

Description will now be given on an experimental example (7-1) of manufacturing an object, which is coated with a carbon film containing hydrogen and metal oxide, by a film forming device similar to that shown in FIG. 3 except for that the high-frequency electrode 111 and the ground electrode 112 shown in FIG. 14(B) are employed in the plasma producing chamber 10 instead of the RF antenna 110, and the phase shifter 500 is removed.

All the film formation target objects were made of silicone rubber, and each had sizes of 20 cm in diameter and 10 mm in thickness. The electrode (holder 200) of the device had sizes of 40 cm×40 cm (square).

EXPERIMENTAL EXAMPLE 7-1

Formation of Carbon Film Containing Hydrogen and Metal Oxide (Deposition After Pretreatment)

Pretreatment Conditions

Pretreatment gas: 100 sccm of hydrogen ($H_2$) was supplied into the plasma producing chamber 10

High-frequency power: frequency 13.56 MHz, 300 W

Pretreatment pressure: 0.1 Torr

Pretreatment time: 5 minutes

Deposition: Deposition was made after discharging the pretreatment gas.

Deposition material gas:
  20 sccm of benzene ($C_6H_6$) gas was supplied into plasma processing chamber 20.
  20 sccm of TEOS gas was supplied into plasma producing chamber 10.

High-frequency power:
  frequency 13.56 MHz, 300 W for plasma processing chamber 20
  frequency 13.56 MHz, 500 w for plasma producing chamber 10

Deposition pressure: 0.1 Torr

The following table 9 shows results of evaluation made on the experimental example 7-1 as well as the comparative example 5-C and experimental example 6-2 using the foregoing device shown in FIG. 1 in connection with the deposition rate, friction coefficient, wear depth and film hardness as well as the tape peeling test result. The evaluation of the friction coefficient, wear depth and film hardness as well as the tape peeling test result were performed in the same manner as the experimental examples Y-1 and Y-2 already described.

TABLE 9

| | C*5-C | E*6-2 | E*7-1 |
|---|---|---|---|
| $C_6H_6$ amount (sccm) | 20 | 20 | 20 |
| TEOS amount (sccm) | 0 | 20 | 20 |
| deposition rate (nm/min) | 60 | 50 | 60 |
| friction coefficient ($\mu$) | 0.6 | 0.2 | 0.1 |
| wear depth ($\mu$m) | 0.8 | 0.4 | 0.2 |
| hardness | 10 | 10 | 15 |
| tape peeling test (pts) | 10 | 10 | 10 |

As can be seen from the table 9, employment of the deposition device, in which the deposition chamber R is divided into the plasma producing chamber 10 and the plasma processing chamber 20, increases the deposition rate, lowers the friction coefficient and wear depth, and improves the film hardness, as compared with the case of employing the depositing device shown in FIG. 1.

It can also be seen that the powers for gas plasma formation are appropriately selected in the plasma producing chamber 10 and the plasma processing chamber 20, respectively, and thereby the gases are decomposed efficiently with the appropriate powers corresponding to the respective gases.

In the film formation described in (G) and (H), the film hardness can be improved by addition of the metal or the metal compound other than silicon oxide. The materials, which can be used for the above addition, the materials for combination use and the materials produced in the carbon films are exemplified in the table 6 already described. If the addition is not performed simultaneously with supply of the reaction gas, the pure metal can be added.

INDUSTRIAL APPLICABILITY

By forming the carbon film according to the invention on the object such as a machine part, the hardness, lubricity and wear resistance characteristics of the object can be improved. The carbon film according to the invention can be applied to the objects, in which one or more of the hardness, lubricity and wear resistance is required. The carbon film forming method according to the invention can form the above carbon film on the object with good adhesion.

What is claimed is:

1. A carbon film containing fluorine and hydrogen, wherein
   a spectrum determined by FT-IR (Fourier Transform Infrared) spectrum analysis exhibits such a relationship that a ratio (IR.C—F)/(IR.C—H) between a peak area (IR.C—F) in a range from 1000 cm$^{-1}$–1300 cm$^{-1}$ resulting from C—F bonds and a peak area IR.C—H) in a range from 2800 cm$^{-1}$ to 3100 cm$^{-1}$ resulting from C—H bonds is larger than 0, and a spectrum determined by XPS (X-ray photoelectron spectrum analysis) exhibits such a relationship that a ratio ($F_{1S}/C_{1S}$) between a peak intensity resulting from $F_{1S}$ and a peak intensity resulting from $C_{1S}$ is larger than 0 and smaller than 3; and
   wherein a rate of the C—F bonds increases or decreases continuously or stepwise in the direction of the thickness of the film.

2. The carbon film according to claim 1, further containing nitrogen.

3. The carbon film according to claim 1 or 2, further containing at least one of metal, metal compound, silicon and silicon compound.

4. The carbon film according to claim 1 or 2, wherein
   said carbon film is a DLC film containing fluorine and hydrogen.

5. A method of forming a carbon film containing fluorine and hydrogen, in which a carbon film formation base member is located in a deposition chamber, a gas containing a hydrocarbon compound gas and a carbon fluoride compound gas is supplied as a deposition material gas into said deposition chamber, a predetermined pressure is kept in said deposition chamber, plasma is formed from said gas by application or an electric power, said carbon film containing fluorine and hydrogen is formed on said base member from said plasma, and a mixing ratio between said hydrocarbon compound gas and said carbon fluoride compound gas in said supply of the gases is adjusted to form the carbon film providing a spectrum, determined by FT-IR (Fourier Transform Infrared) spectrum analysis, exhibiting such a relationship that a ratio (IR.C—F)/(IR.C—H) between a peak area (IR.C—F) in a range from 1000 cm$^{-1}$–1300 cm$^{-1}$ resulting from C—F bonds and a peak area (IR.C—H) in a range from 2800 cm$^{-1}$ to 3100 cm$^{-1}$ resulting from C—H bonds is larger than 0, and a spectrum, determined by XPS (X-ray photoelectron spectrum analysis), exhibiting such a relationship that a ratio ($F_{1S}/C_{1S}$) between a peak intensity resulting from $F_{1S}$ and a peak intensity resulting from $C_{1S}$ is larger than 0 and smaller than 3; and
   said mixing rate of said hydrocarbon compound gas and said carbon fluoride compound gas in the supply of the gases is changed with time to form the carbon film configured such that the rate of the C—F bonds increase continuously or stepwise as the position moves in the direction of the thickness of the film from the side near said base member to the side remote therefrom.

6. The carbon film forming method according to claim 5, wherein said deposition material gas further contains a nitrogen containing gas and the carbon film further containing nitrogen is formed.

7. The carbon film forming method according to claim 5 or 6, wherein
   said deposition material gas further contains a gas forming at least one of metal, metal compound, silicon and silicon compound and the carbon film further containing at least one of metal, metal compound, silicon and silicon compound is formed.

8. The carbon film forming method according to claim 5, or 6, wherein
   a deposition chamber formed of a plasma producing chamber and a plasma processing chamber connected thereto is employed as said deposition chamber, said base member is located in said plasma processing chamber, a part of said deposition material gas is supplied into said plasma processing chamber, and the other is supplied into said plasma producing chamber, plasma is formed from the gas supplied into said plasma producing chamber by application of an electric power, the plasma is supplied into said plasma processing chamber to decompose the gas supplied into the plasma processing chamber, and thereby said carbon film is formed on said base member.

9. The carbon film forming method according to claim 5 or 6, wherein
   a deposition chamber formed of a plasma producing chamber and a plasma processing chamber connected thereto is employed as said deposition chamber, said base member is located in said plasma processing chamber, a gas forming at least one of metal, metal compound, silicon and silicon compound is further used as a further deposition material gas, the gas is supplied into said plasma producing chamber, said hydrocarbon compound gas and said carbon fluoride compound gas are supplied into said plasma processing chamber, plasma is formed from the gas supplied into the plasma producing chamber by application of an electric power, the plasma is supplied into the plasma processing chamber to decompose the gas supplied into the plasma processing chamber, and thereby the carbon film further containing at least one of metal, metal compound, silicon and silicon compound is formed on the base member.

10. The carbon film forming method according to claim 5 or 6, wherein
a deposition chamber formed of a plasma producing chamber and a plasma processing chamber connected thereto is employed as said deposition chamber, said base member is located in said plasma processing chamber, a sputter target formed of at least one of metal, metal compound, silicon and silicon compound is located in said plasma producing chamber, said hydrocarbon compound gas and said carbon fluoride compound gas are supplied into said plasma processing chamber, a gas for sputtering is supplied into said plasma producing chamber, an electric power is applied to said gas for sputtering to form plasma therefrom, said plasma as well as sputter particles generated by sputtering effected on said sputter target in said plasma are supplied into said plasma processing chamber to decompose said hydrocarbon compound gas and carbon fluoride compound gas supplied into said plasma processing chamber, and thereby the carbon film containing at least one of metal, metal compound, silicon and silicon compound is formed on said base member.

11. The carbon film forming method according to claim 5, or 6, wherein
a deposition chamber formed of a plasma producing chamber and a plasma processing chamber connected thereto is employed as said deposition chamber, said base member is located in said plasma processing chamber, a part of said deposition material gas is supplied into said plasma processing chamber, and the other is supplied into said plasma producing chamber, plasma is formed from the gas supplied into said plasma producing chamber by application of an electric power, plasma is also formed from said gas supplied into the plasma processing chamber by application of an electric power, and thereby said carbon film is formed on said base member.

12. The carbon film forming method according to claim 5 or 6, wherein
a deposition chamber formed of a plasma producing chamber and a plasma processing chamber connected thereto is employed as said deposition chamber, said base member is located in said plasma processing chamber, a gas forming at least one of metal, metal compound, silicon and silicon compound is further used as a further deposition material gas, the gas is supplied into said plasma producing chamber, said hydrocarbon compound gas and said carbon fluoride compound gas are supplied into said plasma processing chamber, plasma is formed from the gas supplied into the plasma producing chamber by application of an electric power, plasma is also formed from said gas supplied into said plasma processing chamber by application of an electric power, and thereby the carbon film further containing at least one of metal, metal compound, silicon and silicon compound is formed on the base member.

13. The carbon film forming method according to claim 5 or 6, wherein
a deposition chamber formed of a plasma producing chamber and a plasma processing chamber connected thereto is employed as said deposition chamber, said base member is located in said plasma processing chamber, a sputter target formed of at least one of metal, metal compound, silicon and silicon compound is located in said plasma producing chamber, said hydrocarbon compound gas and said carbon fluoride compound gas are supplied into said plasma processing chamber, a gas for sputtering is supplied into said plasma producing chamber, an electric power is applied to said gas for sputtering to form plasma therefrom, sputter particles generated by sputtering effected on said sputter target in said plasma are supplied into said plasma processing chamber, plasma is also formed from said hydrocarbon compound gas and carbon fluoride compound gas supplied into said plasma processing chamber by application of an electric power, and thereby the carbon film further containing at least one of metal, metal compound, silicon and silicon compound is formed on said base member.

14. The carbon film forming method according to claim 11, wherein
said mixing rate of said hydrocarbon compound gas and said carbon fluoride compound gas in the supply of the gases is changed with time to form the carbon film configured such that the rate of the C—F bonds increase continuously or stepwise as the position moves in the direction of the thickness of the film from the side near said base member to the side remote therefrom.

15. The carbon film forming method according to claim 5 or 6, wherein
said carbon film containing fluorine and hydrogen is a DLC film.

16. The carbon film forming method according to claim 10 or 6, wherein
a high-frequency power prepared by effecting amplitude modulation with a predetermined modulation frequency on a basic high-frequency power of a predetermined frequency is employed as said electric power for gas plasma formation.

17. The carbon film forming method according to claim 16, wherein
a high-frequency power prepared by effecting amplitude modulation with a predetermined modulation frequency in a range from 1/100000 to 1/10 of a frequency of a basic high-frequency power on said basic high-frequency power is employed as said electric power for gas plasma formation.

18. The carbon film forming method according to claim 10 or 6, wherein
the film formation surface of said base member is exposed to plasma of at least one of a fluorine containing gas, hydrogen gas and oxygen gas prior to the carbon film formation as a pretreatment of the surface of the base member.

19. A carbon-film-coated object coated with the carbon film as set forth in claim 1 or 2.

20. The carbon-film-coated object according to claim 19, wherein at least a surface of said object coated with said carbon film is made of rubber and/or resin.

21. The carbon-film-coated object according to claim 19, wherein at least a surface of said object coated with said carbon film is made of metal and/or ceramic material.

22. A method of manufacturing a carbon-film-coated object, wherein an object coated with a carbon film is manufactured by employing a predetermined object as said carbon film formation base member in the carbon film forming method as set forth in claim 5 or 6.

23. The method of manufacturing the carbon-film-coated object according to claim 22, wherein at least a surface of said object coated with said carbon film is made of rubber and/or resin.

24. The carbon-film-coated object according to claim 22, wherein at least a surface of said object coated with said carbon film is made of metal and/or ceramic material.

* * * * *